(12) United States Patent
Kamada et al.

(10) Patent No.: US 6,249,049 B1
(45) Date of Patent: Jun. 19, 2001

(54) CERAMIC PACKAGE TYPE ELECTRONIC PART WHICH IS HIGH IN CONNECTION STRENGTH TO ELECTRODE

(75) Inventors: Hiroshi Kamada; Naoharu Fukuhara; Katuya Terai; Hiroshi Katoh, all of Shiga (JP)

(73) Assignee: NEC Corporation, Toyko (JP)

( * ) Notice: Subject to any disclaimer, the term of this patent is extended or adjusted under 35 U.S.C. 154(b) by 0 days.

(21) Appl. No.: 09/330,967

(22) Filed: Jun. 11, 1999

(30) Foreign Application Priority Data

Jun. 12, 1998 (JP) .................................................. 10-165205
Jun. 19, 1998 (JP) .................................................. 10-173712

(51) Int. Cl.$^7$ .................................................. H01L 23/06
(52) U.S. Cl. ........................... 257/703; 257/782; 257/783
(58) Field of Search ..................... 257/703, 782, 257/783

(56) References Cited

U.S. PATENT DOCUMENTS 5,185,550 * 2/1993 Morita et al. ........................ 310/344
5,272,590 * 12/1993 Hernandez ........................ 361/306.2

FOREIGN PATENT DOCUMENTS

09116047 * 5/1997 (JP) .............................. H01L/21/60
11251867 * 9/1999 (JP) .............................. H03H/9/25

OTHER PUBLICATIONS

Ono, "Tendency of Ceramic Package for Quartz Device", Quartz Device, 18 No. 1, 1996, pp. 36–38, Japanese Quartz Device Industry Association.

* cited by examiner

Primary Examiner—David Yu
Assistant Examiner—Shih-Chao Chen
(74) Attorney, Agent, or Firm—Hutchins, Wheeler & Dittmar

(57) ABSTRACT

A ceramic package type electronic part for accommodating an electronic device includes a ceramic package body, an electrode, and a conductive adhesive. The electrode is disposed for the ceramic package body and is to be bonded to the electronic device. The conductive adhesive bonds the electronic device and the electrode to each other. The conductive adhesive is provided to be extended to a specific surface portion of a surface portion of the ceramic package body, from a bonding portion of the electronic device and the electrode.

23 Claims, 23 Drawing Sheets

GREEN SHEET

PRE-PRESSING

PRINTING

LAMINATION PRESSING

HALF-CUTTING

DE-BINDING

BAKING

BREAKING

ACTIVATION

PLATING

ELECTRODE FORMING STEP

US 6,249,049 B1

CERAMIC PACKAGE TYPE ELECTRONIC PART WHICH IS HIGH IN CONNECTION STRENGTH TO ELECTRODE

BACKGROUND OF THE INVENTION

1. Field of the Invention

The present invention relates to a ceramic package type electronic part. More particularly, the present invention relates to a ceramic package type electronic part which is high in connection strength to an electrode.

2. Description of the Related Art

IC devices and other electronic parts have been improved year by year. Operation of high accuracy is required of a high graded electronic device, for example, an IC device and an SAW (Surface Acoustic Wave Filter) resonator. Thus, in many cases, it is used in a condition that it is mounted in a hermetically sealed package. Such a package is required to protect the electronic device against the high density of a wiring circuit, the thermal generation thereof, the change of temperature and moisture, dust and other ambient environments. Such a hermetically sealed package has been developed more and more in recent years.

FIG. 1 shows a ceramic package type electronic part 190 created by hermetically mounting the electronic device in a so-called ceramic package, in such a hermetically sealed package. In FIG. 1, a cover 193 is illustrated at a top of FIG. 1, an electronic device (for example, a piezoelectric device, such as a quartz oscillator) 192 is illustrated thereunder, and a base 191 is further illustrated thereunder. In this ceramic package type electronic part 190, an inner electrode 197 positioned on the base 191 and the quartz oscillator 192 are electrically connected to each other. The quartz oscillator 192 hermetically sealed by guiding a conductive line to an outer connection portion (outer electrode) 125 linked to the inner electrode 197 is adapted to serve as a part of an outer electronic circuit.

FIG. 2 is a side section view showing the ceramic package type electronic part 190 of FIG. 1.

In the ceramic package type electronic part 190, the quartz oscillator 192 is hermetically enclosed and positioned within a ceramic case 122. At right and left ends of the quartz oscillator 192, it is connected through conductive adhesives 124 to the inner electrode 197. The inner electrode 197 is integrally extended up to the outer connection portion 125, and connected through solder or the like to, for example, a wiring on a printed circuit board on which this ceramic package type electronic part 190 is mounted, outside the ceramic case 122.

The side on which the quartz oscillator 192 of this ceramic package is positioned, namely, the portion between the base 191 and the hermetically enclosing cover 193 thereon is hermetically sealed and bonded with a glass 126. The reason why the portion is hermetically sealed and adhered with the glass 126 is as follows. That is, a very precise operation is required of the piece of the quartz oscillator 192. Thus, the change of the inner ambient of this ceramic case 122 has influence on the operation. Hence, the portion between the base 191 and the cover 193 is typically sealed with the glass 126, from the viewpoint of the hermetic sealing, the reliability thereof and the like.

FIG. 3 is a side section view showing another ceramic package or another ceramic package type electronic part. As shown in FIG. 3, a quartz oscillator 202 is connected through a conductive substrate 205 to an inner electrode 207 located on a left side of a base 201, and supported in a cantilever state. This inner electrode 207 is linked to an outer electrode 208 through a conductive line 206 wired on ceramic. Moreover, after the quartz oscillator 202 serving as the electronic device is fixed on the base 201, an opening is enclosed by a cover 209, and the quartz oscillator 202 is hermetically sealed. Usually, this cover 209 hermetically encloses the base 201 made of ceramic material by using glass and the like.

A method of typically manufacturing such a ceramic package or a ceramic package type electronic part will be described below. In general, such a ceramic package or a ceramic package type electronic part is manufactured by using a green sheet method. In the green sheet method, element on which conductor paste is printed is laminated on alumina green sheet created by a doctor blade method, and then the laminated element is collectively baked. The green sheet method is a method of manufacturing a circuit substrate having a high reliability for various type of electronic devices, quartz oscillators, piezoelectric actuators, SAW oscillators, ICs, LSIs and VLSIs or other devices with high reliability.

The ceramic body, such as a multiple-layer circuit substrate, a ceramic package or the like, made by this method has the following features.

Firstly, the easy lamination of a number of sheets each having hyperfine wiring enables the high density wiring.

Secondly, the operation of baking and forming an Insulation substrate and a conductor at the same time makes the integration thereof perfect and also makes the reliability thereof high.

A basic process of manufacturing the multiple-layer circuit substrate and the like, for example, the ceramic package by using the green sheet method will be described below with reference to FIGS. 4A to 4I and FIGS. 5A to 5E.

As shown in FIG. 4A, alumina of raw material powder, flux, binder, plasticizer and solvent are sufficiently mixed with each other in a ball mill and made into slurry. As shown in FIGS. 4B and 4C, element in which this slurry is extended and dried on a carrier tape by using a blade is referred to as a green sheet. This method is referred to as the doctor blade method, and this is typically used. This green sheet has a thickness between about 0.1 and 1.0 mm. The thickness can be adjusted as necessary (FIG. 4D).

The conductive paste created in the state of metal powder having a high melting point on this green sheet is screen printed (FIG. 4E). As a method of creating the multiple-layer in the green sheet method, there are three methods: a sheet lamination method; a print multiple-layer method and a method of jointly using both the methods. However, the frequently used method is the sheet lamination method.

According to the sheet lamination method, a hole is made in the green sheet by using a die or a micro drill. The conductive paste is filled into the hole. A plurality of sheets on which patterns are printed are laminated (FIG. 4F). Then, they are baked in reduction ambience (FIG. 4H). Accordingly, the ceramic body or the ceramic package body is manufactured (FIG. 4I).

Then, such a ceramic body is machined to a form of case. An electronic device whose function is deteriorated by environment is mounted in the case. Then, it is hermetically sealed and put to practical use. In this case, a so-called box-shaped portion of this ceramic case is referred to as a base, and an element placed thereon is referred to as a cover.

The above-mentioned sheet lamination method is a very excellent method. The schematic specification is, for example, as follows.

Wiring material is tungsten system material, molybdenum system material or other materials. About 0.08 mm is possible as the minimum line width, about 0.1 mm is possible as the minimum line interval, about 0.1 mm is possible as the minimum through hole diameter, and about 0.25 mm is possible as the minimum through hole pitch. Also, alumina between about 90 and 94% is used as the material of the conventionally used raw material powder. Its thermal expansion coefficient is $75\times10^{-7}/°C$., its dielectric constant is 8.5 and its specific resistance is about $10\times10^{14}$ Ω/cm. The number of about 45 layers or more is possible as the maximum number of laminations of green sheets laminated as mentioned above.

Here, the above-mentioned wiring material connects the electric device mounted inside this ceramic case to the wiring positioned on, for example, a printed circuit board and the like mounted outside this ceramic case. There are an inner electrode and an outer connection portion in the wiring material. The inner electrode is a portion wired inside the ceramic case. The outer connection portion is wired outside the ceramic case, and electrically connected to the printed circuit board and the like. The inner electrode and the outer connection portion can be connected to each other through a wiring of a predetermined interval by using the tungsten or the molybdenum. Or, the inside of the through hole and the like are formed with conductive material through which the outer connection portion and the inner electrode can be electrically connected to each other.

A process of integrating a plurality of green sheet into a single unit will be described below. The plurality of green sheets are made into the single unit by molding after the lamination. The most recommended integrating method is a low temperature isotropic consolidation molding method, namely, a so-called CIP method. This CIP method is explained. At first, laminated green sheets serving as raw material are put into a rubber bag. They are put into pressure transfer solution (pure viscous liquid) accommodated in a compression vessel. Under this condition, the transfer solution is compressed. Accordingly, raw material powder in the bag is consolidated in isotropy by pascal pressure generated in the transfer solution. Since it is pressed in isotropy from all quarters by the pascal pressure, further high isotropic compression, high dense compression and uniform compression can be generated as compared with a case of single axis consolidation. Thus, it is possible to obtain high density molding which is superior in formation.

This method will be described below with reference to FIGS. 5A to 5E. At first, green sheets 110 in which ceramic sheets are punched to target shapes are prepared (FIG. 5A). The green sheets 110 are machined to green sheets 111, 112 on which patterns are printed (FIG. 5B). These green sheets are piled up to create a lamination body 113 (FIG. 5C). This lamination body 113 is put into a vinyl bag 114 or a rubber bag to then pack it (FIG. 5D). The packed vinyl bag 114 or rubber bag into which the lamination body 113 of the green sheets is put is made vacuous so that the vinyl bag 114 or the rubber bag is adhered to the lamination body 113 of the green sheets (FIG. 5E). Then, isotropic press is applied thereto to generate a ceramic body 115 (FIG. 5E).

In addition, there is a high temperature isotropic consolidation molding method, namely, a so-called HIP method, other than the low temperature isotropic consolidation molding method. However, this method employs the similar principle. The reason why such a low temperature isotropic consolidation molding method is carried out is as follows. That is, the isotropic press causes the binders contained in the green sheets to be softened. Then, the portions between the green sheets are adhered to each other with the softened binders. Finally, the ceramic body 115, namely, a ceramic package or an intermediate body is completed.

As mentioned above, the ceramic package or the ceramic package type electronic part is completed as shown in FIG. 1. The ceramic package or the ceramic package type electronic part is finally placed on a mother board, namely, a circuit board to then create a circuit having one function as a whole.

As can be understood from the above-mentioned description, a process of especially controlling a surface roughness of the green sheet is not included in the above-mentioned manufacturing method. A surface of the green sheet typically has a surface roughness between about 1 and 50 microns. On the other hand, the above-mentioned wiring is wired by various methods. However, the material thereof is made of metal, and a surface roughness thereof is relatively superior to that of the surface of the green sheet. That is, as to the surface roughness, the surface of the wiring, namely, the inner electrode is smooth, and the surfaces of the green sheet, namely, the bottom side and the inner wall of the ceramic case are rough.

As shown in FIG. 2, the conductive adhesive 124 is used to connect the quartz oscillator 192 and the inner electrode 197 to each other. In this conductive adhesive 124, a number of metal powders each having a small particle diameter are enclosed in organic material. The conductive adhesive 124 uses the metal powders to then ensure conductive paths so that the quartz oscillator 192 and the inner electrode 197 are electrically connected to each other. By the way, the electronic device represented by such an enclosed quartz oscillator must be surely fixed to the inner electrode 197, from the viewpoint of the insurance of its operational accuracy and the like. Of course, the electronic device does not function if it is removed from the inner electrode 197. Moreover, if crack is induced in a part of the inner electrode 197, or if the resistance of the connection portion between the inner electrode 197 and the quartz oscillator 192 is changed by any impact, it has influence on the operational accuracy to thereby result in a problem.

Here, a problem shown in FIG. 6 may be induced. As shown in FIG. 6, if impact is applied from external portion, this results in a problem that a conductive adhesive 134 for connecting between an electronic device 131 (in this example, a quartz oscillator) enclosed within a ceramic case 132 and an inner electrode 133 is stripped from the inner electrode 133, or a crack is induced between the inner electrode 133 and the electronic device 131. The reasons why these problems are induced are as follows. Firstly, since the quartz oscillator 131 itself is enclosed within the ceramic case 132 only with the conductive adhesive 134, the strong force is applied to that portion. Secondly, the adhesive strength between the inner electrode 133 and the conductive adhesive 134 is weak.

Thus, in order to solve the above-mentioned problems, it is enough to employ the adhesive whose adhesive strength is stronger. However, a rate of organic solvent occupying the conductive adhesive must be increased to make the adhesive strength stronger. As a result, a rate of the metal particles which ensure the conductivity and are small in particle diameter becomes small, which results in problems that if the resistance thereof is increased, the reliability of the ceramic package type electronic part is poor, or if the resistance thereof is excessively increased, trouble is incurred in a circuit design.

Hence, from the above-mentioned standpoints, it is desirable that the conductive adhesive contains the metal particles with minor particle diameters as much as possible to thereby reduce the rate of the organic solvent occupying the conductive adhesive. However, this method can not improve the adhesive strength between the conductive adhesive and the inner electrode.

As mentioned above, this type of ceramic package or the ceramic package type electronic part in which the electronic device is enclosed therein is electrically mechanically connected and fixed to the electronic circuit on the mother board by soldering, when it is placed on the mother board (circuit board). Usually, this connection is carried out by using solder. In this case, as the soldering manner, a method referred to as a re-flow solder is mainly used especially in recent years.

The re-flow solder is simply described. Solder material in a form of cream paste is mounted on a printed board by print. This type of ceramic package or ceramic package type electronic part is placed on this solder material, and passed through a high temperature furnace. Accordingly, the cream solder is fused. After that, it is cooled. Then, the ceramic package or the ceramic package type electronic part is electrically mechanically connected on the mother board.

By the way, there is a method referred to as a dip solder, as another conventional method. The dip solder is a method of dipping electronic devices mechanically fixed on a circuit board into molten solder solution and then removing them. Accordingly, the solder easily adapted to the metal exposure portions on the circuit board and in the ceramic package stays thereon. Then, it is cooled to accordingly carry out the electric mechanic connection similar to the above-mentioned case.

There are additionally various methods. In a general, various electronic parts placed on the mother board, for example, the ceramic package and the ceramic package type electronic part in the present invention are designed so as to create one electronic circuit as a whole through the solder connection.

In the ceramic package or the ceramic package type electronic part in the present invention, the electronic devices to be accommodated therein are required to be placed within it. For this reason, this portion also needs the electrical connection and the mechanical connection. However, as mentioned above, the very high accuracies are required of the electronic devices to be hermetically enclosed and placed within it. They are very weak against heat, various gases, dusts and the like. Thus, in many cases, it is difficult to directly solder this electronic device. Hence, a method other than the soldering, for example, a conductive organic adhesive is used if, for example, the electronic device such as the quartz oscillator is mounted within the ceramic package. In this case, the solder is still used for the connection between the circuit board and the outer electrode mounted outside the ceramic package.

However, this conductive organic adhesive has characteristic different from the solder used when the ceramic package or the ceramic package type electronic part is mounted on the circuit board (mother board). As a result, if the outer electrode guided from the ceramic package to the external portion and the inner electrode within the ceramic package are made of the material identical to each other, this leads to the trouble that, for example, a certain material is superior in adaptation to the conductive adhesive and inferior in adaptation to the solder. On the contrary, a certain material is superior in adaptation to the solder and inferior in adaptation to the conductive adhesive.

Such inferiority in the adaptation between the metal and the conductive adhesive or the solder is not in the degree to which the electronic device can not be always created. Thus, conventionally, the structure of the electrode of the ceramic package is determined by sacrificing the adhesive strength in any one of the outer electrode and the Inner electrode.

For example, if the electronic device hermetically enclosed within the ceramic package must be strongly fixed against vibration from external portion and the like, the connection strength between the inner electrode and the electronic device within the ceramic package is emphasized by sacrificing the connection through the solder between the circuit board and the outer electrode.

However, the reliability of the electronic device within the ceramic package as well as the circuit board in which such electronic devices are mounted has been separately required at high levels, in recent years. The policy of sacrificing any one of them has not been allowed from those circumstances.

A thesis entitled "Tendency of Ceramic Package for Quartz Device" written by Ono is noted in "Quartz Device" 18 No.1, 1996, pages 36–38, published in Japanese Quartz Device Industry Association. This thesis announces that an alumina multiple-layer ceramic package can satisfy a condition of hermetic reliability and an insurance of space for accommodating a piezoelectric device, in a surface mount operation of a quartz device. It is noted therein that a surface mount type can improve the connection reliability since solder is protuberant on metallization of a side groove at a time of solder re-flow. As a process of manufacturing the ceramic package, it is noted therein that a product is completed by carrying out break-out/inspection after plating/brazing, after firing, after scoring after laminating, after pattern printing, after via printing, after punching, after blank sheet and after tape making.

SUMMARY OF THE INVENTION

The present invention has been made to solve the above-described problems of the conventional ceramic package type electronic part accommodating an electronic device. An object of the present invention is to provide a ceramic package type electronic part which is high in connection strength to electrode.

In order to achieve an aspect of the present invention, a ceramic package type electronic part for accommodating an electronic device, includes a ceramic package body, an electrode which is disposed for the ceramic package body and which is to be bonded to the electronic device, and a conductive adhesive which bonds the electronic device and the electrode to each other, wherein the conductive adhesive is provided to be extended to a specific surface portion of a surface portion of the ceramic package body, from a bonding portion of the electronic device and the electrode.

In this case, wherein thermal expansion coefficients of the ceramic package body and the electronic device are substantially matched with each other.

Also in this case, wherein the specific surface portion is higher in surface roughness than a part of the ceramic package body surface portion on which the conductive adhesive is not provided.

Further in this case, wherein the specific surface portion is a part of the ceramic package body surface portion different from a part of the ceramic package body surface portion on which the electrode is disposed.

In this case, wherein the ceramic package body has a concave section, and the specific surface portion is an inner bottom surface portion of the concave section of the ceramic package body surface portion.

Also in this case, wherein the ceramic package body has a concave section, and the specific surface portion is an inner side surface portion of the concave section of the ceramic package body surface portion.

Further in this case, wherein a surface roughness of the specific surface portion is in a range from 1 micron to 50 microns.

In order to achieve another aspect of the present invention, a ceramic package type electronic part for accommodating an electronic device, includes a ceramic package body having a concave section, an electrode which is disposed for the ceramic package body and which is to be bonded to the electronic device, and a conductive adhesive which bonds the electronic device and the electrode to each other, wherein the electrode is disposed In a position away from an inner corner portion of the concave section, and the conductive adhesive is provided to fill the inner corner portion and to be extended to a surface portion of the inner corner portion, from a bonding portion of the electronic device and the electrode.

In order to achieve still another aspect of the present invention, wherein one end of the electronic device is bonded with the conductive adhesive to the electrode, and the other end of the electronic device is a free end which is not fixed to the ceramic package body.

In this case, wherein the one end of the electronic device is embedded in the conductive adhesive.

Also in this case, wherein the ceramic package body includes a base and a cover which encloses the base, and the conductive adhesive is provided to be extended to a bottom surface portion of the cover, from a bonding portion of the electronic device and the electrode.

In order to achieve yet still another aspect of the present invention, a ceramic package includes a base fixing an electronic device, an inner electrode disposed inside the base and connected to the electronic device, and an outer electrode disposed outside the base and connected to the inner electrode, wherein a surface portion of the outer electrode is made of refractory material which is superior in solderability to a surface portion of the inner electrode.

In this case, wherein the electronic device and the inner electrode are fixed with a conductive adhesive.

Also in this case, wherein the surface portion of the inner electrode is made of alloy of silver and palladium, and the surface portion of the outer electrode is made of gold (Au).

Further in this case, wherein the outer electrode includes a side surface electrode positioned on an outer side surface portion of the base and a bottom surface electrode positioned on an outer bottom surface portion of the base.

In this case, wherein the side surface electrode has a stuck portion from the outer side surface portion into the base.

Also in this case, wherein the side surface electrode is positioned in a specific concave portion disposed on the outer side surface portion.

Further in this case, wherein the specific concave portion is a longitudinal groove.

In this case, wherein a dummy side surface electrode is provided in the specific concave portion not to be connected to the inner electrode.

Also in this case, wherein the specific concave portion is filled with solder, and the solder fills the specific concave portion such that when the solder is fused by heating, the ceramic package is fixed to a circuit board with the fused solder.

In order to achieve another aspect of the present invention, a ceramic package includes a base fixing an electronic device, an inner electrode disposed inside the base and connected to the electronic device, and an outer electrode disposed outside the base and connected to the inner electrode, wherein the outer electrode includes a side surface electrode positioned on an outer side surface portion of the base and a bottom surface electrode positioned on an outer bottom surface portion of the base, and the side surface electrode has a stuck portion from the outer side surface portion into the base.

In order to achieve still another aspect of the present invention, a ceramic package includes a base fixing an electronic device, an inner electrode disposed inside the base and connected to the electronic device, an outer electrode disposed outside the base and connected to the inner electrode, and an outer dummy electrode disposed outside the base not to be connected to the inner electrode, wherein at least one of the outer electrode and the outer dummy electrode includes a side surface electrode positioned on an outer side surface portion of the base and a bottom surface electrode positioned on an outer bottom surface portion of the base.

Therefore, an object of the present invention is to improve a bonding strength between a conductive adhesive and an inner electrode, especially if an electronic device mounted within a ceramic case is disposed in the inner electrode with the conductive adhesive.

Moreover, an object of the present invention is to provide a ceramic package and a ceramic package type electronic part which can sufficiently keep an electric mechanic connection strength between an electronic device and an inner electrode within the ceramic package when the electronic device is enclosed within the ceramic package and also sufficiently keep even a solder connection strength between a portion on a circuit board serving as a mother board and an outer electrode of the ceramic package at the same type.

BRIEF DESCRIPTION OF THE DRAWINGS

A more complete understanding of the teachings of the present invention may be acquired by referring to the accompanying figures, in which like reference numbers indicate like features and wherein.

DESCRIPTION OF THE PREFERRED EMBODIMENTS

Referring now to drawings, various preferred embodiments according to the present invention will be described in detail.

A first embodiment is a ceramic package type electronic part, in which an electronic device is bonded to an inner electrode with conductive adhesive, and then the conductive adhesive is spread up to an inner bottom surface of a ceramic package.

Figure 1:
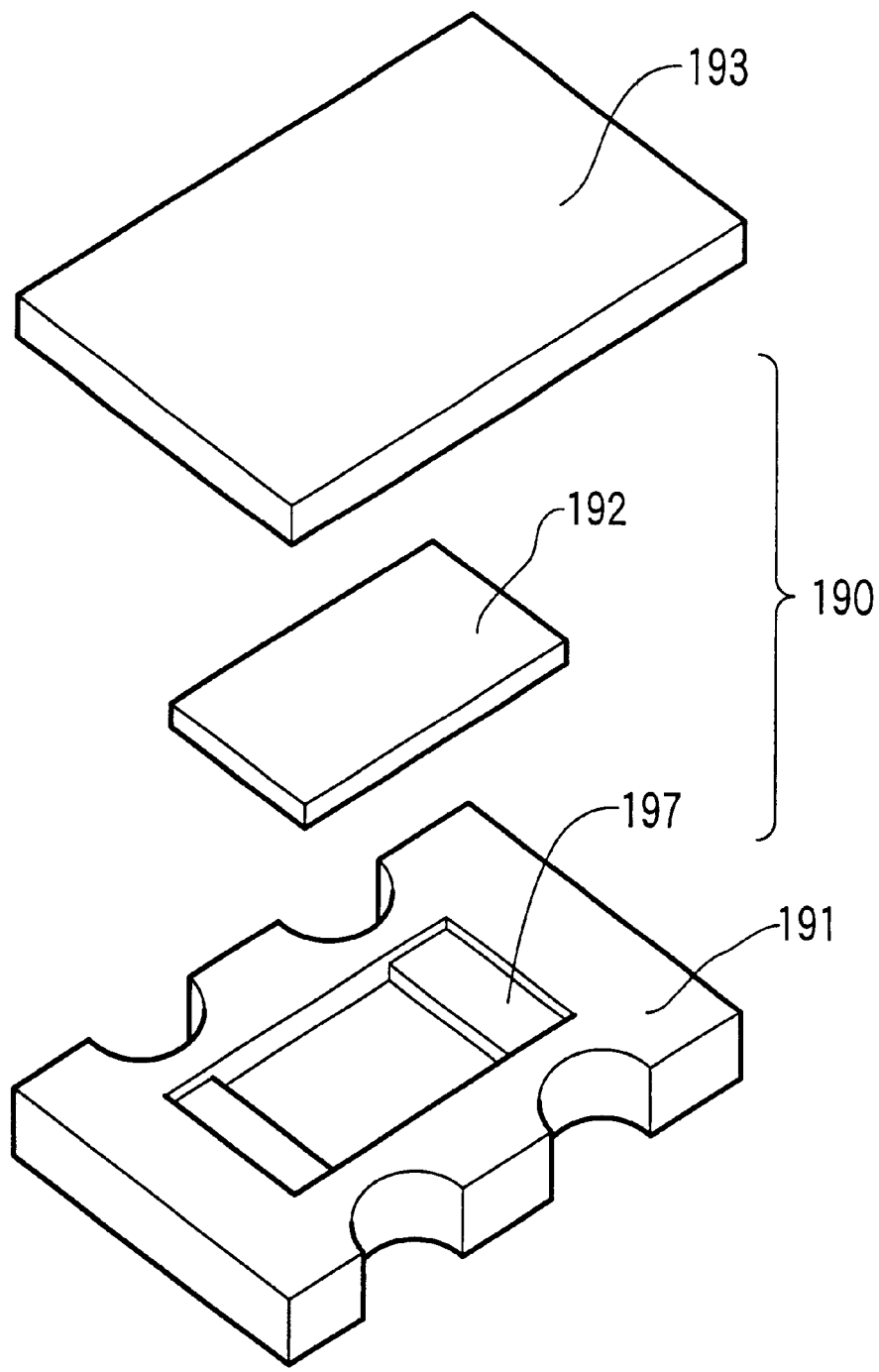
FIG. 1 is an exploded perspective view of a conventional ceramic package type electronic part.
Figure 2:
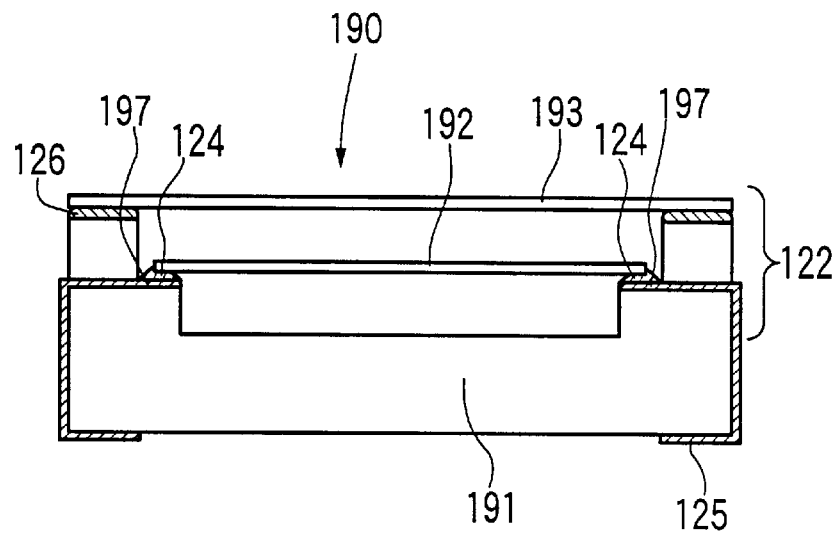
FIG. 2 Is a section view of the conventional ceramic package type electronic part.
Figure 3:
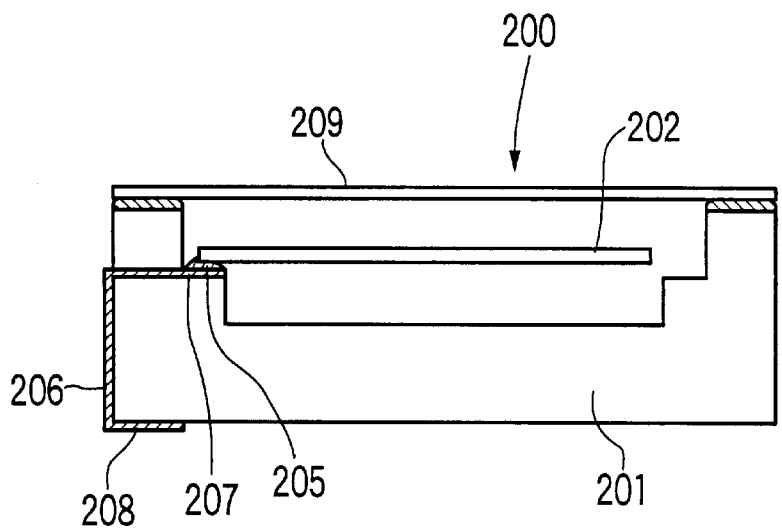
FIG. 3 is a section view of another conventional ceramic package type electronic part.
Figures 4A, 4B, 4C, 4D, 4E, 4F, 4G, 4H, 4I:
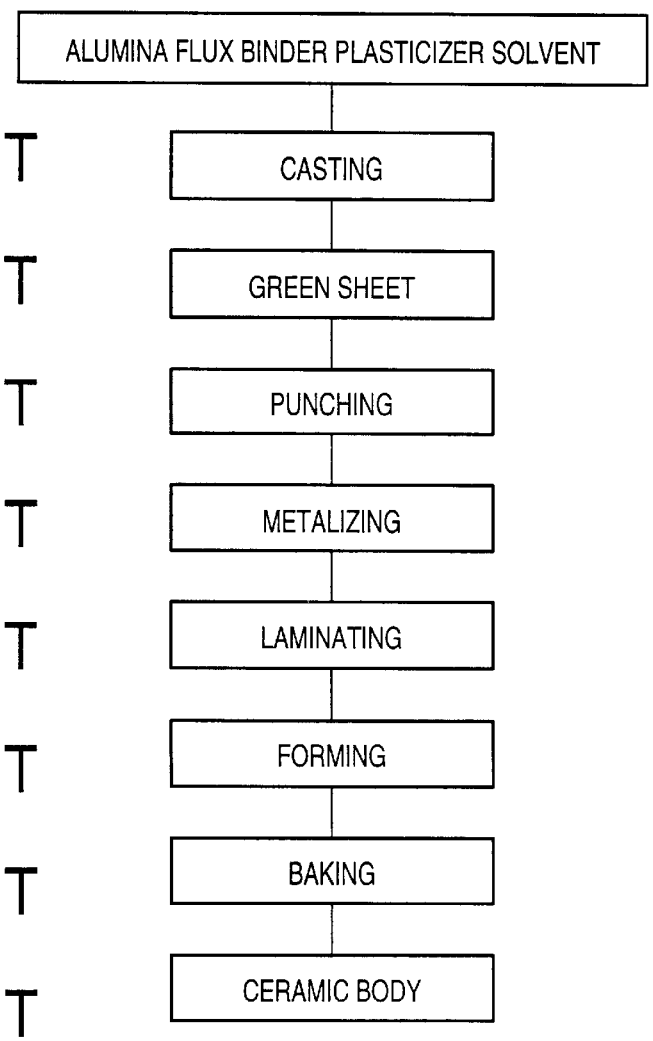
FIG. 4A is a view of a manufacturing process of a ceramic body.
FIG. 4B is a view of another manufacturing process of the ceramic body.
FIG. 4C is a view of still another manufacturing process of the ceramic body.
FIG. 4D is a view of still another manufacturing process of the ceramic body.
FIG. 4E is a view of still another manufacturing process of the ceramic body.
FIG. 4F is a view of still another manufacturing process of the ceramic body.
FIG. 4G is a view of still another manufacturing process of the ceramic body.
FIG. 4H is a view of still another manufacturing process of the ceramic body.
FIG. 4I is a view of still another manufacturing process of the ceramic body.
Figure 5A:
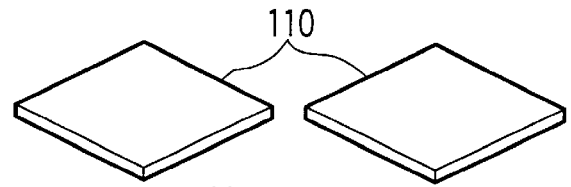
FIG. 5A is a perspective concept view of an intermediate part in a manufacturing process of the ceramic body.
Figure 5B:
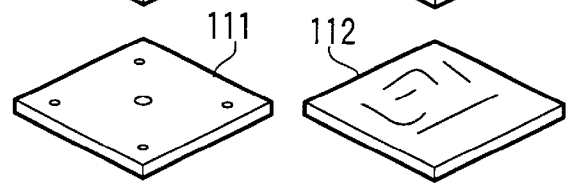
FIG. 5B is a perspective concept view of an intermediate part in another manufacturing process of the ceramic body.
Figure 5C:
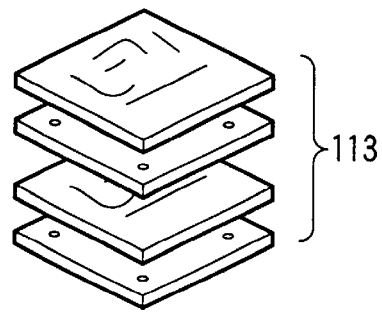
FIG. 5C is a perspective concept view of an intermediate part in still another manufacturing process of the ceramic body.
Figure 5D:
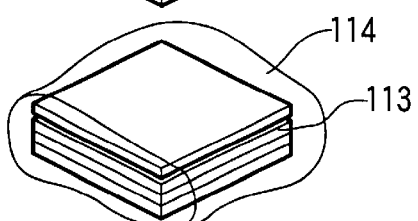
FIG. 5D is a perspective concept view of an intermediate part in still another manufacturing process of the ceramic body.
Figure 5E:
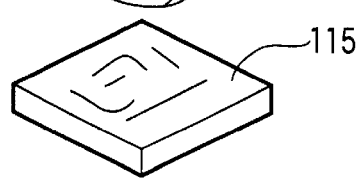
FIG. 5E is a perspective concept view of an intermediate part in still another manufacturing process of the ceramic body.
Figure 6:
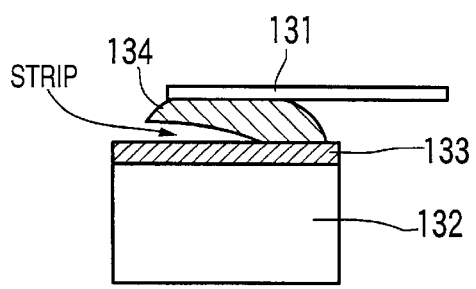
FIG. 6 is an enlarged main portion view showing a state that a conductive adhesive is stripped by impact in the conventional ceramic package.
Figure 7A:
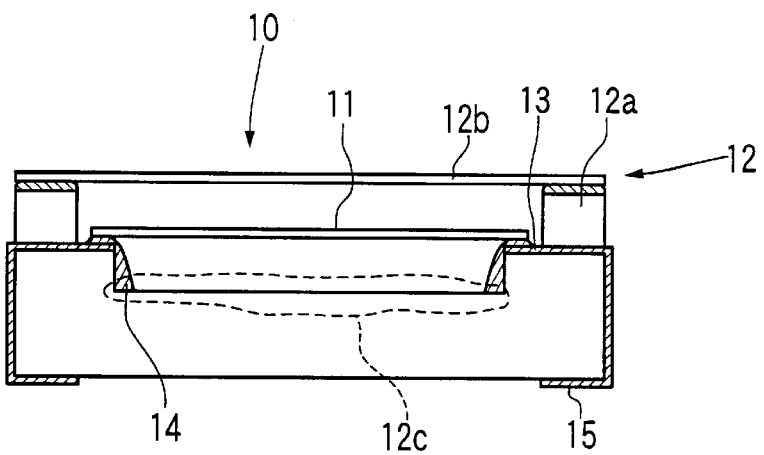
FIG. 7A is a section view showing a first embodiment of a ceramic package type electronic part in the present invention.
Figure 7B:
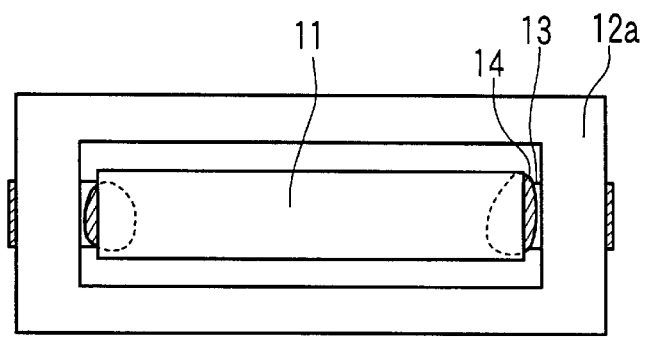
FIG. 7B is a front view showing the first embodiment of the ceramic package type electronic part in the present invention.

As shown in FIGS. 7A and 7B, the conductive adhesive is spread up to the inner bottom surface of the ceramic package as well as a portion between the inner electrode and the electronic device. Accordingly, the conductive adhesive is bonded to the electronic device within the ceramic package, the inner electrode within the ceramic package and the inner bottom surface of the ceramic package. As a result, this widens an area in which the conductive adhesive is supported, and further improves the mechanical strength against impact from external action as compared with the conventional technique.

Especially, a surface of the ceramic package is higher in surface roughness than a surface of the inner electrode to be the metal wiring as mentioned above. That is, the surface of the ceramic package is rough. Thus, the conductive adhesive provided on the inner bottom surface of the ceramic package is extremely stronger in adhesive strength than conductive material merely positioned on the inner electrode.

Hence, the conductive adhesive strongly bonded to the inner bottom surface of the ceramic package is integrally bonded to the electronic device within the ceramic package and the inner electrode. Even if there is the impact from the external portion, since the strong mechanical strength of the conductive adhesive bonded to the inner bottom surface of the ceramic package reduces the fact that the conductive adhesive is stripped from the inner electrode or that crack is induced between the inner electrode and the conductive adhesive.

Here, an element such as a semiconductor device, an element such as a piezoelectric device and other functional devices may be considered as the kind of electronic device. For example, an element such as a quartz oscillator and an element such as a piezoelectric actuator may be considered as the piezoelectric device. Moreover, an element such as an SAW oscillator may be considered as other functional device. In a case of these devices, the ambient in which any of the devices is mounted has influence on an operational accuracy thereof. Thus, typically, it is hermetically enclosed within the ceramic package, and the electrical connection is attained by using the conductive adhesive.

As mentioned above, this inner electrode 13 (refer to FIGS. 7A and 7B) is integrated with an outer connection portion 15 and composed of a wiring pattern having a predetermined line width, a through hole or the like. As material of the ceramic package, various materials may be considered depending on the kind of electronic device mounted within the ceramic package. If thermal stress, remaining stress and the like applied to the electronic device may have influence on the operation of the electronic device, it is desirable that a thermal expansion coefficient of the electronic device agrees with that of a ceramic material of the ceramic package.

For example, in a case of the quartz oscillator, the thermal expansion coefficient of the ceramic material of the ceramic package may be about 100 to $150 \times 10^{-7}/°C$. If the thermal expansion coefficients agree with each other in this way, it is possible to solve the problem of the thermal stress between the conductive adhesive spread up to the inner bottom surface of the ceramic case, namely, the ceramic package and the quartz oscillator or the other electronic devices. Thus, the conductive adhesive is further strongly bonded to the quartz oscillator and the ceramic package, to thereby make the mechanical strength stronger.

This is actually described in the case of the quartz oscillator. Composite material of glass and ceramic in which forsterite is dispersed in glass by 30 to 70 weight % is suitable for the ceramic material. Such dispersion enables the thermal expansion coefficient of the ceramic material to be adjusted to about 100 to 150×⁻⁷/°C. Moreover, as material of the glass, composite material is further desirable in which $SiO_2$ is 50 to 70 weight %, $Al_2O_3$ is 2 to 15 weight %, ZnO is 2 to 15 weight %, oxide of potassium, strontium, barium and the like is 5 to 30 weight %, $B_2O_3$ is 1 to 8 weight % and oxide of sodium and potassium is 5 to 30 weight %.

In order to improve a bending strength of this ceramic material, namely, the ceramic package to a necessary strength, it is desirable to use an element in which average particle diameters of the glass and the ceramic are sufficiently reduced up to about 1 to 3 microns. In addition, if the bending strength is especially needed, it is desirable to set the average particle diameter of the ceramic to about 0.5 microns. In order to further improve the bending strength, it is desirable to mix this with one or more elements of $ZnO_2$, $SnO_2$, $P_2O_5$ and $MoO_2$ by 0.2 to 5 weight % to then crystallize the glass at a time of baking.

The above-mentioned configuration enables the thermal expansion coefficients of the package material, and the quartz oscillator and the like to be matched with each other. Moreover, this configuration can reduce the remaining distortion of the piece of the electronic device after heating and cooling and further suppress the variation of a resonant frequency and the other unexpected variation of the operational accuracy. Accordingly, this configuration can surely bond the quartz oscillator to the inner bottom surface of the ceramic package with the conductive adhesive and further prevent the remaining stress and the thermal stress from staying in the bonding portion.

The formation of the ceramic material is simply described. In the case of the ceramic material for the above-mentioned quartz oscillator, at first, glass ceramic is pulverized with the ball mill. After it is dried, powder press is performed on it. Then, it is baked at 80° C. to 1000° C., and cut to a rectangular parallelepiped. Then, the bending strength and the thermal expansion coefficient are measured. After the measurement, only the samples having the sufficiently excellent result are selected to put to actual product. Of course, it is possible to use ceramic materials other than those described in this embodiment.

The above-mentioned first embodiment is shown in FIGS. 7A and 7B.

In a ceramic package type electronic part 10, an electronic device 11 is mounted in a ceramic package 12 by using a conductive adhesive 14. The conductive adhesive 14 is spread up to an inner bottom surface 12c of the ceramic package 12 provided with a base 12a and a cover 12b. As mentioned above, the operation of manufacturing the ceramic package, namely, the ceramic case by means of the green sheet method or the like does not control the surface roughness of the green sheet. Thus, the surface roughness is typically rough so that the adhesive strength between the conductive adhesive and the inner bottom surface of the ceramic package is strong. The cover 12b of the ceramic package 12 hermetically covers the base 12a of the ceramic package 12 with the fusion of glass and the like. In addition, a symbol 13 denotes the inner electrode, and a symbol 15 denotes the outer connection portion.

A second embodiment will be described below. The second embodiment is a ceramic package type electronic part, in which, as mentioned above, the electronic device is bonded to the inner electrode with the conductive adhesive, and the conductive adhesive is spread up to an inner wall surface of the ceramic package.

While the conductive adhesive is spread up to the inner bottom surface of the ceramic package in the first embodiment, it is spread up to the inner wall surface of the ceramic package in the second embodiment.

If the conductive adhesive is spread up to the inner wall surface of the ceramic package, the sufficient bonding strength can be obtained in a narrower area in contact with the inner wall surface of the ceramic package than that of the first embodiment. In general, a section where the green sheet is cut appears on the inner wall surface of the ceramic package, in the method of manufacturing the ceramic package as described in the conventional technique, namely, the ceramic case. With regard to the section of the green sheet, the surface thereof is rougher than that of the inner bottom surface of the ceramic package.

This reason is similar to that of the case in which a section when soft clay material is cut with a knife is rough. Thus, if the conductive adhesive is spread to such a roughed inner wall surface, the bonding strength of the conductive adhesive per unit area is further stronger than that of the case in which the conductive adhesive is spread to the inner bottom surface. Hence, the second embodiment is effective in a case described below. For example, if the conductive adhesive is spread to the inner bottom surface of the ceramic package when it is difficult to spread the conductive adhesive to the inner bottom surface of the ceramic package, the conductive adhesive is adhered to the electronic device itself since there is little gap from the bottom surface of the electronic device mounted within the ceramic package.

Incidentally, the second embodiment is not always limited to the example that it is applied separately from the first embodiment. Of course, the conductive adhesive can be spread up to the inner bottom surface of the ceramic package similarly to the first embodiment, and simultaneously it can be spread up to the inner wall surface of the ceramic package.

Figure 8A:
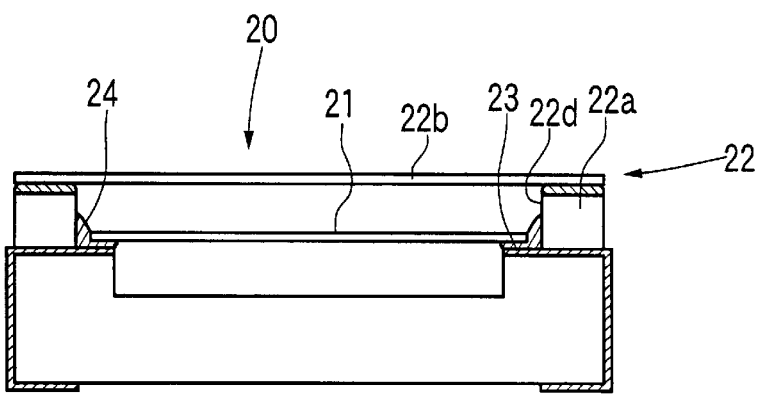
FIG. 8A is a section view showing a second embodiment of the ceramic package type electronic part in the present invention.
Figure 8B:
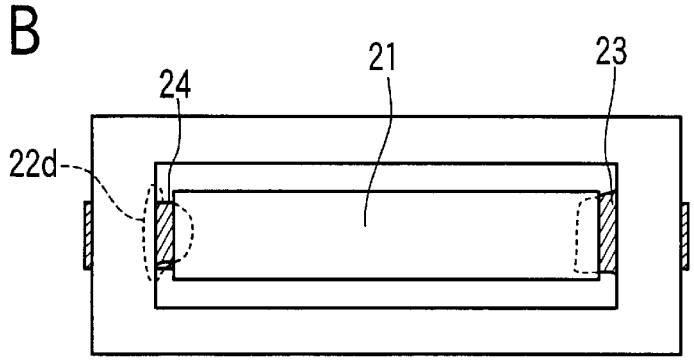
FIG. 8B is a front view showing the second embodiment of the ceramic package type electronic part in the present invention.

FIGS. 8A and 8B show the second embodiment. In a ceramic package type electronic part 20, a conductive adhesive 24 for connecting an electronic device 21 to an inner electrode 23 is spread up to an inner wall surface 22d of a ceramic package 22. A symbol 22a denotes a base, and a symbol 22b denotes a cover.

Figure 9A:
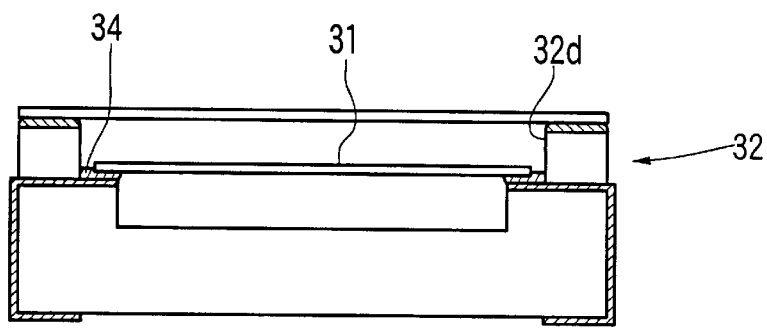
FIG. 9A is a section view showing a variation example of the second embodiment of the ceramic package type electronic part in the present invention.
Figure 9B:
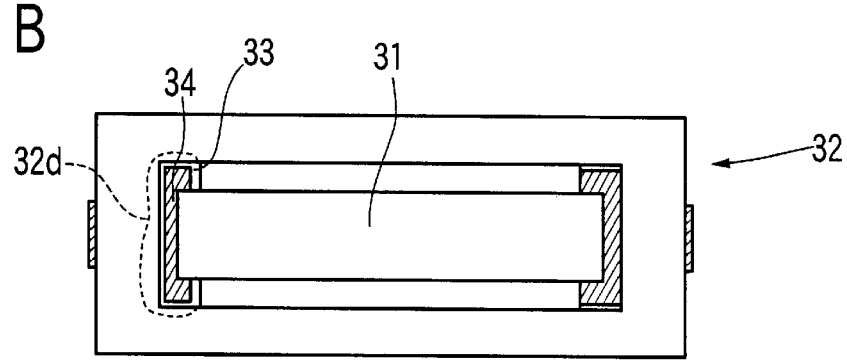
FIG. 9B is a front view showing the variation example of the second embodiment of the ceramic package type electronic part in the present invention.

FIGS. 9A and 9B show still another embodiment. The difference between the embodiment shown in FIGS. 8A and 8B and the embodiment shown in FIGS. 9A and 9B is as follows. The inner electrode 23 in FIGS. 8A and 8B has only a width dimension substantially equal to a width of the electronic device 21 mounted within the ceramic package 22. On the contrary, an inner electrode 33 in FIGS. 9A and 9B is positioned over the entire width of a ceramic package 32.

Accordingly, when the inner electrode 33 and the electronic device 31 mounted within the ceramic package 32 are bonded to each other through a conductive adhesive 34, a sufficient quantity of conductive adhesive 34 can be provided around an electrode of the electronic device 31, as compared with the case in FIGS. 8A and 8B. Thus, this can enlarge the area in contact with an inner wall surface 32d of the ceramic package 32. Hence, this has a merit of obtaining the sufficient adhesive strength, namely, the sufficient bonding strength.

A third embodiment will be described below with reference to FIGS. 10A and 10B. The third embodiment is a ceramic package type electronic part, in which an electronic device is bonded to an inner electrode through conductive adhesive, and the inner electrode is positioned away from a corner within a ceramic package, and the conductive adhesive is spread up to the corner within the ceramic package.

Figure 10A:
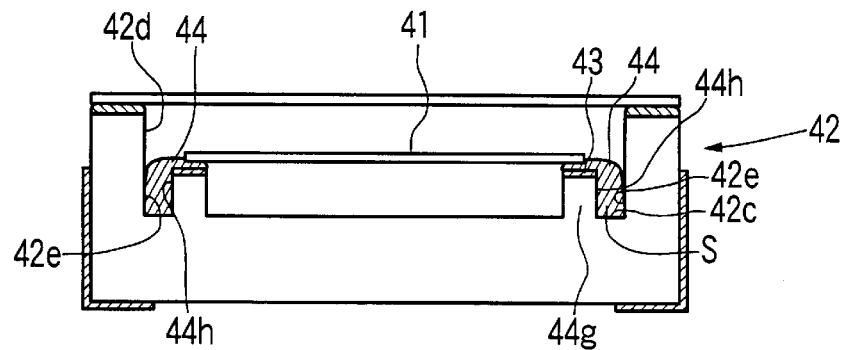
FIG. 10A is a section view showing a third embodiment of the ceramic package type electronic part in the present invention.
Figure 10B:
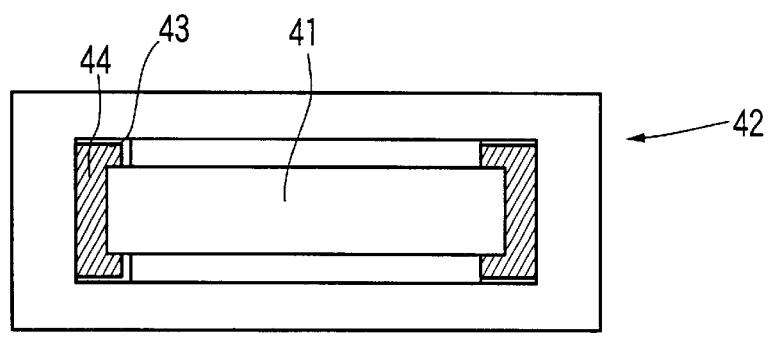
FIG. 10B is a front view showing the third embodiment of the ceramic package type electronic part in the present invention.

As can be understood from FIGS. 10A and 10B, an inner electrode 43 is positioned away from a corner 42e within a ceramic package 42. The reason why the inner electrode 43 is positioned away from the corner 42e within the ceramic package 42 is as follows. That is, such a configuration enables a predetermined space S to be ensured at a portion of a corner and also enables a conductive adhesive 44 to be provided in the space S. As a result, it is possible to make a bonding area between the conductive adhesive 44 and an inner bottom surface 42c or an inner wall surface 42d of the ceramic package 42 sufficiently large to thereby make the bonding strength between the conductive adhesive 44 and the ceramic package 42 sufficiently strong.

As can be understood from FIGS. 10A and 10B, the inner electrode 43 is positioned at a slightly interior side from the corner 42e. Thus, a space S like groove is formed at the portion of the corner. Hence, a sufficient quantity of conductive adhesive 44 can be provided at this portion. This conductive adhesive 44 is in contact with an inner wall surface 44h of a trapezoidal portion 44g supporting the inner electrode 43, an inner bottom surface 42c of the ceramic package and an inner wall surface 42d of the ceramic package. Accordingly, an area in contact with the inner bottom surface of the ceramic package is further larger than that of the embodiments shown in FIGS. 7A to 9B to thereby make the bonding strength and the adhesive strength to the conductive adhesive 44 very strong. Therefore, even if very strong impact is applied from the external portion, the electronic device 41 can be sufficiently surely bonded to the ceramic package without any strip of the conductive adhesive 44.

In addition, the third embodiment is not limited to the example shown in FIGS. 10A and 10B. In short, in the conventional ceramic package, a corner portion of the ceramic package is occupied by an electrode or a protuberant portion, namely, a trapezoidal portion to support the electrode. In this embodiment, a portion in which the conductive adhesive stays is ensured by opening the corner portion. Such a configuration can be regarded as the third embodiment.

Figure 11:
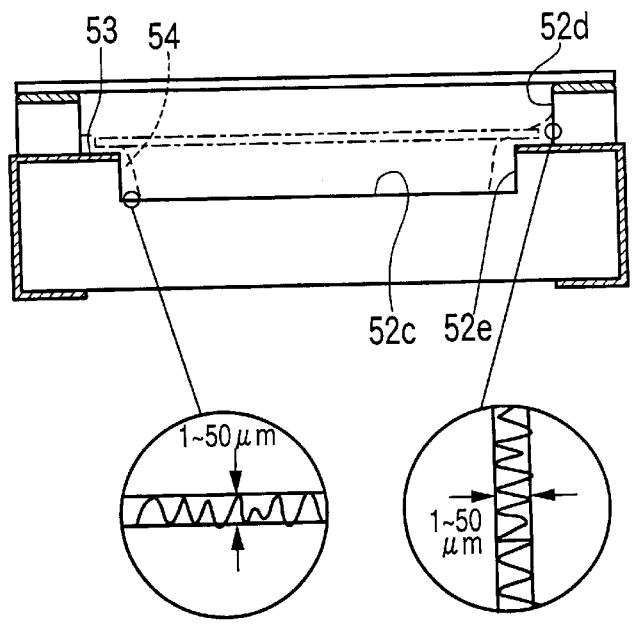
FIG. 11 is a section view showing surface roughnesses of an inner bottom surface and an inner wall surface of a fourth embodiment of the ceramic package in the present invention.

A fourth embodiment will be described below with reference to FIG. 11. The fourth embodiment is a ceramic package type electronic part, in which an inner surface of the ceramic package has a surface roughness in a range between 1 micron and 50 microns, in the first to third embodiments.

The inner surface of the fourth embodiment contains the inner bottom surface 52c and the inner wall surface 52d in the first to third embodiments. Of course, the inner surface of the fourth embodiment also contains the convex portion for supporting the inner electrode 53, namely, the inner wall surface 52e of the trapezoidal portion.

The reason why the surface roughness of the inner surface of the ceramic package is set to the value in the range between 1 micron and 50 microns as mentioned above is as follows. That is, if the surface roughness is less than 1 micron, the sticking strength between a conductive adhesive 54 and the inner surface of the ceramic package becomes weaker so that the bonding strength can not be made stronger. If the surface roughness is greater than 50 microns, crack is easily induced in the ceramic package when the impact is applied from the external portion. If so, the mechanical strength is deteriorated on the contrary.

The surface roughness ranges between 1 micron and 50 microns in the fourth embodiment. However, it is desirable that the surface roughness ranges between 10 and 20 microns. In addition, the surface roughness of the inner surface of the ceramic package may range between about 1 and 50 microns, as shown in FIG. 11. However, it is not necessary that all the portions on the inner surface do not always have this surface roughness. Then, the portion where the conductive adhesive is provided may have this surface roughness.

Figure 12A:
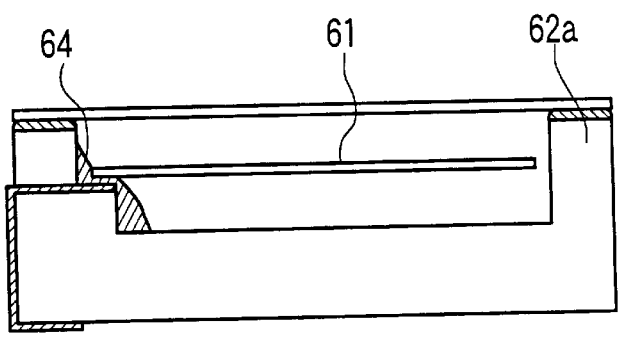
FIG. 12A is a section view showing a fifth embodiment of the ceramic package type electronic part in the present invention.
Figure 12B:
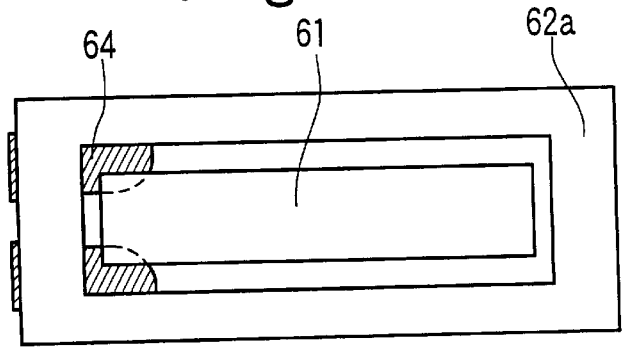
FIG. 12B is a front view showing the fifth embodiment of the ceramic package type electronic part in the present invention.

A fifth embodiment will be described below. The fifth embodiment is a ceramic package type electronic part, in which the electronic device in the first to fourth embodiments is a piezoelectric device created in a form of rectangular plate, and this piezoelectric device is bonded to the inner electrode with the conductive adhesive in such a way that this piezoelectric device is supported in a condition of cantilever. As shown in FIGS. 12A and 12B, an electronic device which is bonded and mounted within a ceramic package 62a is a piezoelectric device 61 created in the form of rectangular plate. It is supported within the ceramic package 62a in the condition of cantilever through a conductive adhesive 64.

The merit is described in which the piezoelectric device is supported in the condition of cantilever as mentioned above. The portion in which the piezoelectric device is mechanically fixed is only one piece of the rectangular plate, and the whole thereof is kept free. For this reason, the stress resulting from heat or external force does not affect the piezoelectric device. Thus, it is possible to reduce the variation in the operation of the piezoelectric device resulting from the external stress. In this case, such a configuration causes the piezoelectric device in the form of rectangular plate to be fixed only at one piece thereof. Accordingly, the force applied to that portion is larger, which results in a problem that the strip and the like are induced unless the adhesive strength is sufficiently large. Hence, the first to fourth embodiments provide the large effect for the supporting type of the piezoelectric device in the fifth embodiment.

Figure 13A:
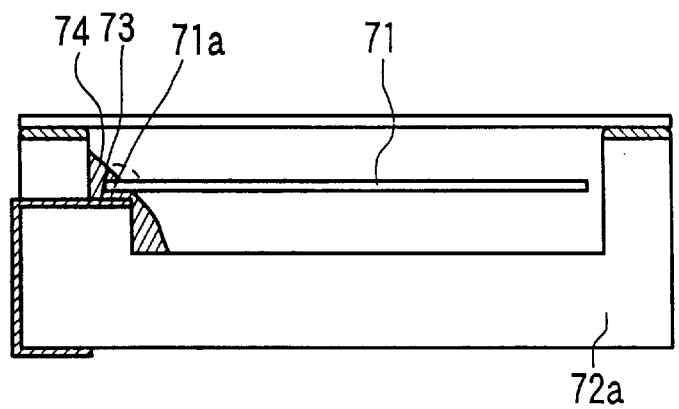
FIG. 13A is a section view showing a sixth embodiment of the ceramic package type electronic part in the present invention.
Figure 13B:
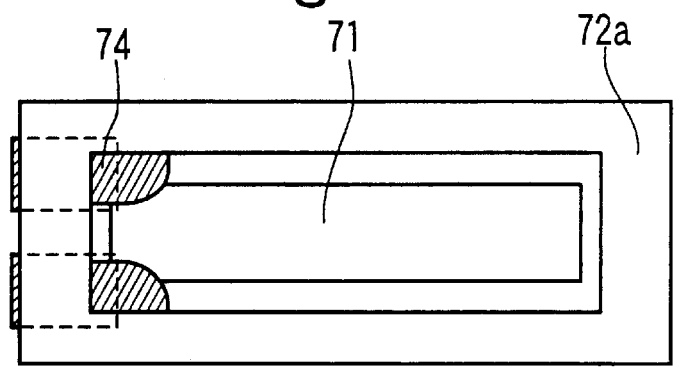
FIG. 13B is a front view showing the sixth embodiment of the ceramic package type electronic part in the present invention.

A sixth embodiment will be described below with reference to FIGS. 13A and 13B.

The electronic device is a piezoelectric device 71 created in the form of rectangular plate. In the ceramic package type electronic parts in the first to fourth embodiments, if the piezoelectric device 71 in the form of rectangular plate is bonded to an inner electrode 73 by using the conductive adhesive 74, an end 71a of the piezoelectric device is embedded with the conductive adhesive 74, and the piezoelectric device 71 in the form of rectangular plate is supported in the condition of cantilever. In the sixth embodiment, the end 71a of the piezoelectric device 71 is embedded with the conductive adhesive 74.

Similarly to the fifth embodiment, if the electronic device 71 is supported within the ceramic package in the condition of cantilever, the adhesive strength between the inside of the ceramic package and the conductive adhesive 74 for supporting the piezoelectric device must be stronger than that of the case in which the electronic device 71 is supported at both the ends. From this standpoint, the end 71a of the electronic device 71 is embedded in the conductive adhesive 74. Since the end 71a is embedded in this way, the contact area between the conductive adhesive 74 and the inside of the ceramic package is made larger, which results in the stronger adhesive strength between the conductive adhesive 74 and the inside of the ceramic package 72a.

Figure 14:
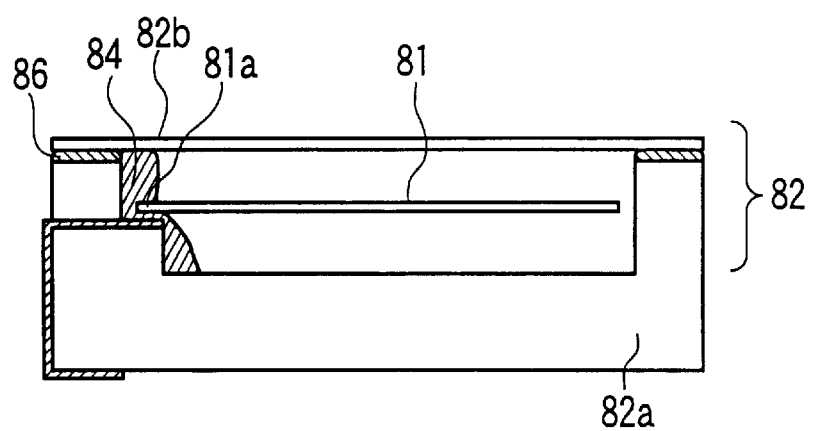
FIG. 14 is a section view showing a seventh embodiment of the ceramic package type electronic part in the present invention.

A seventh embodiment will be described below with reference to FIG. 14. The electronic device is a piezoelectric device in the form of rectangular plate. In the first to fourth embodiments, if the conductive adhesive is used to bond the piezoelectric device to the inner electrode, the end of the piezoelectric device is embedded in the conductive adhesive, and the conductive adhesive is spread up to the bottom surface of the cover of the ceramic package, and then this piezoelectric device is supported in the condition of cantilever. The seventh embodiment relates to the structure of providing a conductive adhesive 84 if a piezoelectric device 81 in the form of rectangular plate is supported in the condition of cantilever, similarly to the fifth or sixth embodiment.

In the seventh embodiment, similarly to the sixth embodiment, an end 81*a* of the piezoelectric device is embedded in the conductive adhesive 84, and simultaneously this conductive adhesive 84 is spread up to a bottom surface of a cover 82*b* of a ceramic package 82. Since the conductive adhesive 84 is spread up to the bottom surface of the cover 82*b* of the ceramic package 82 as mentioned above, the contact area between the conductive adhesive 84 and the inner surface of the ceramic package 82 is made yet larger. As a result, the bonding strength between the conductive adhesive 84 and the inside of the ceramic package 82 is made stronger, proportionally to the increase of the contact area.

Incidentally, the seventh embodiment describes the case in which the piezoelectric device is supported in the condition of cantilever. However, it is not always limited to this structure. So, it may be applied to the case in which the piezoelectric device is supported at both the ends. As such a structure body, the conductive adhesive is firstly coated on the inner bottom surface and the inner wall surface of the ceramic package, in order to enclose the piezoelectric device. Then, the piezoelectric device is fixed in a condition that it is in contact with the coated conductive adhesive until the conductive adhesive reaches a certain hardness. Moreover, a glass 86 is placed on the coated conductive adhesive in a condition that the conductive adhesive is additionally coated on the conductive adhesive. The ceramic package is heated after the cover 82*b* is put on the placed glass 86.

In this case, it is natural that the cover 82*b* of the ceramic package must not be made of conductive material. However, it is allowable that the portion of the base 82*a* of this ceramic package 82 is entirely made of the ceramic material, the main material in the portion of the cover 82*b* is made of metal material, and only the portion of the bottom surface of the cover 82*b* is made of insulation material. In addition, the bottom surface of the cover of the ceramic package in the seventh embodiment implies the portion exposed on the inner surface side of the ceramic package, in the cover.

As mentioned above, according to the first to seventh embodiments, even the ceramic package type electronic part, in which the electronic device is bonded to the inner electrode with the conductive adhesive within the ceramic package, and the impact from the external portion and the like do not cause the conductive adhesive from being stripped and do not induce the crack, and the required operational accuracy is high, can achieve the high reliability and have the sufficiently strong resistance to the external impact.

An eighth embodiment will be described below.

The eighth embodiment is a ceramic package provided with a base for fixing an electronic device and a cover for enclosing the electronic device in this base. In the ceramic package, an inner electrode for fixing the electronic device to the base has the surface made of alloy of silver and palladium, and an outer electrode linked to this inner electrode has the surface made of gold (Au).

Figure 15A:
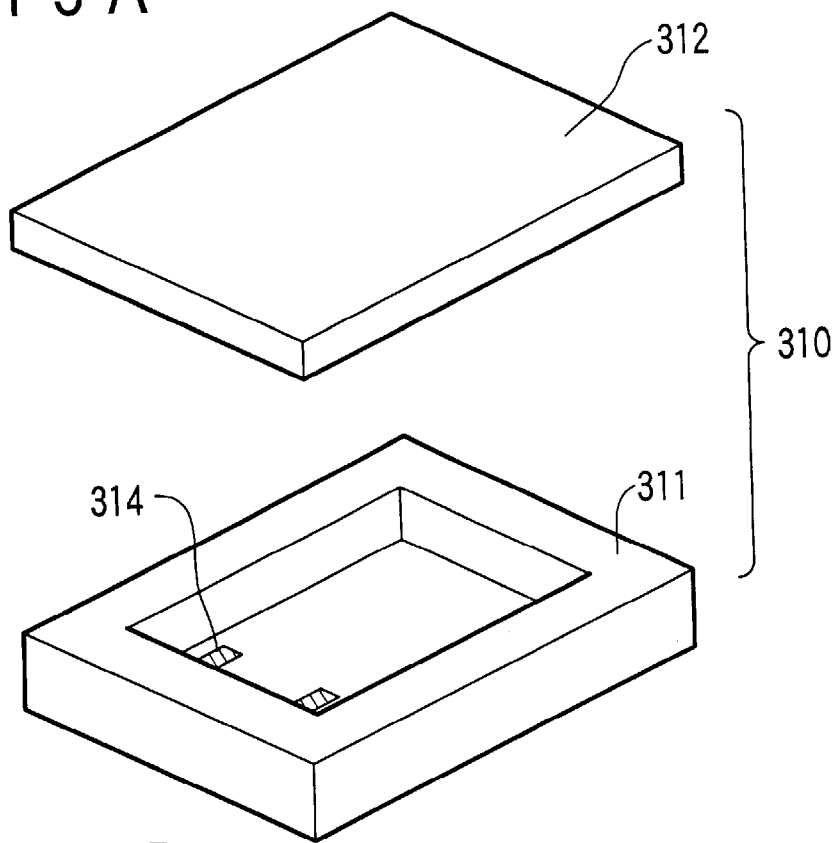
FIG. 15A is an exploded perspective view showing an eighth embodiment of the ceramic package in the present invention.

This invention is illustrated in FIGS. 15A to 20. At first, FIG. 15A shows a ceramic package 310 of the eighth embodiment in a condition that it is separated into a base 311 and a cover 312. FIG. 15B is a view showing the overturned base 311 so as to illustrate an outer electrode 313 disposed on a bottom surface of the base 311 in the ceramic package 310. As shown in FIG. 15A, the ceramic package 310 is provided with the base 311, the cover 312 and the cavity inside the base 311. The cover 312 is made of strong hermetic material such as glass and the like, in order to hermetically enclose an electronic device (not shown) mounted on the base 311. The cover 312 is placed on the base 311.

Figure 15B:
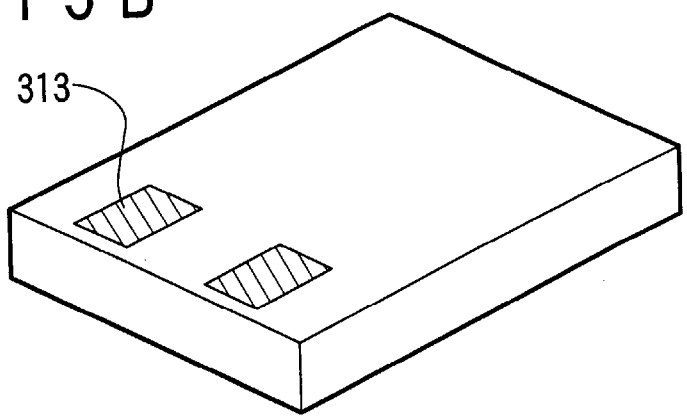
FIG. 15B is a rear view showing the eighth embodiment of the ceramic package in the present invention.

An inner electrode 314 for mechanically electrically connecting the electronic device hermetically enclosed within this ceramic package 310 is positioned on the base 311. In FIG. 15B, the inner electrodes 314 are positioned at two locations. However, they are not always limited to the two locations. Also, the inner electrode 314 may be positioned at any location, and a plurality of inner electrodes 314 may be positioned. Moreover, although the base 311 is box-shaped in FIG. 15B, it is not always limited to that shape. The base 311 may have various shapes in addition to a circle, an ellipsoid and the like.

The ceramic package in the present invention is a package using the ceramic material. The ceramic package in the present invention is not always limited to the package in which the cover and the base are all made of the ceramic material. Especially, it is not necessary that the cover is made of the ceramic material. For example, the cover may be made of metal, organic resin and the like.

In this embodiment, the surface of the inner electrode is made of the alloy of silver and palladium, as mentioned above. The surface of the outer electrode linked to this inner electrode is made of the gold. The reason why the metal materials of the respective surfaces of the inner electrode and the outer electrode are changed in this way is to improve the coupling performance between each of the inner electrode and the outer electrode and the conductive adhesive and the solder.

The utilization of the conductive adhesive is effective for the bonding performance between, for example, the alloy of silver and palladium or the alloy of silver and platinum and the electronic device. However, if the electronic device is connected to the alloy of silver and palladium or the alloy of silver and platinum through the solder, this connection is poor at solder adhesive performance and solder heat resistance. Thus, it is undesirable to form both the inner electrode and the outer electrode by using the alloy of silver and palladium or the alloy of silver and platinum.

On the other hand, even if the electronic device is bonded with the conductive adhesive in a case of using, for example, alloy of tungsten, nickel and gold, the bonding performance is not so excellent between the electronic device and the alloy of tungsten, nickel and gold. The solderability and the solder heat resistance are excellent on the contrary. However, it is not well to use alloy, such as the alloy of tungsten, nickel and gold to then form both the inner electrode and the outer electrode in the ceramic package. From such standpoint, as the inner electrode in the ceramic package, it is desirable to select the material which is very compatible with the conductive adhesive and is low in bonding performance, bonding strength and electric resistance of the electronic device. As the outer electrode in the ceramic package, it is desirable to select the material which is high in heat resistance and is superior in solderability.

In view of the above-mentioned circumstances, the surface of the inner electrode is made of the alloy of silver and palladium, and the surface of the outer electrode linked to this inner electrode is made of the gold, in this embodiment. Incidentally, the present invention is not limited to the above-mentioned combinations. This embodiment includes the case in which the inner electrode is made of the material having the strong bonding performance to the electronic device if the conductive adhesive is used, and the outer electrode is made of the material which is superior in the solderability and the solder heat resistance.

In this embodiment, the surfaces of the inner electrode and the outer electrode are made of the respective materials of the alloy of silver and palladium and the gold, as mentioned above. In this case, it is not always necessary that the respective inner electrode and outer electrode are entirely made of the alloy of silver and palladium and the gold, respectively. If their surfaces are respectively made of the alloy of silver and palladium and the gold, it is possible to obtain the sufficient device bonding performance, solderability and solder heat resistance.

Figure 16A:
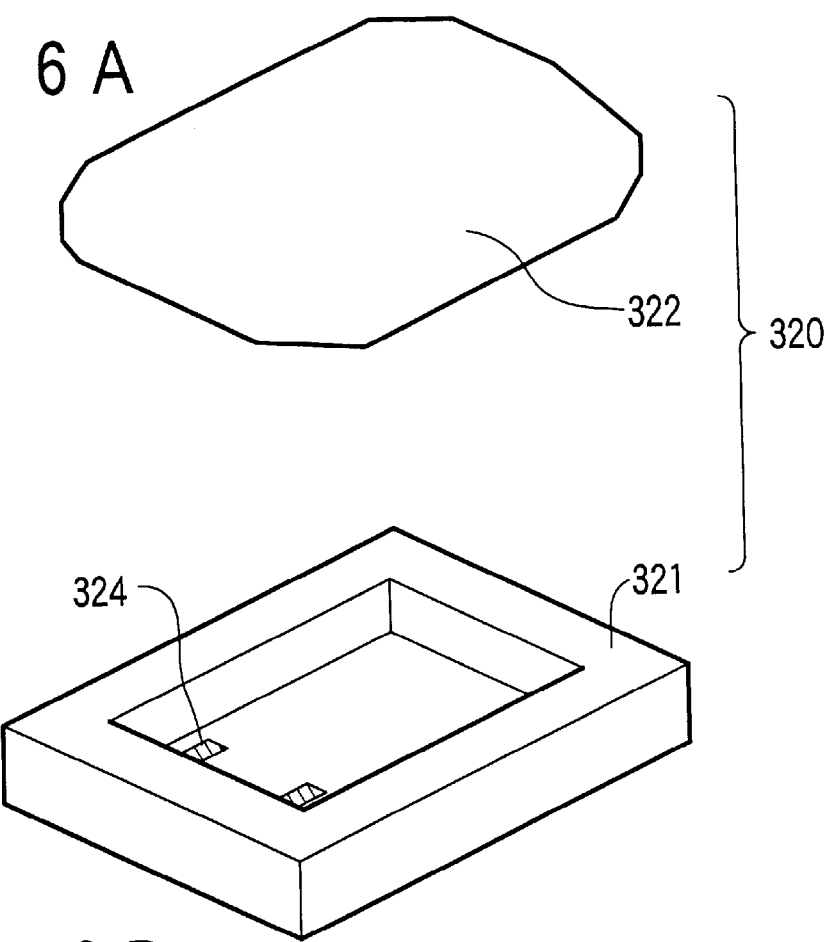
FIG. 16A is an exploded perspective view showing a variation example of the eighth embodiment of the ceramic package in the present invention.
Figure 16B:
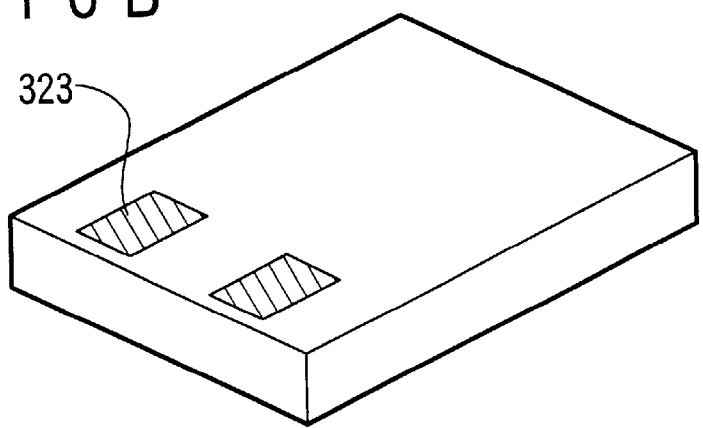
FIG. 16B is a rear view showing the variation example of the eighth embodiment of the ceramic package in the present invention.

FIG. 16A shows a ceramic package 320 if a cover 322 is made of metal. In the ceramic package 320 shown in FIGS. 16A and 16B, the surface of an inner electrode 324 positioned within a base 321 made of the ceramic material is made of the alloy of silver and palladium, and the surface of an outer electrode 323 is made of the gold, similarly to the case of FIGS. 15A and 15B.

A step of manufacturing the ceramic package in the eighth embodiment will be described below.

Figure 17A:
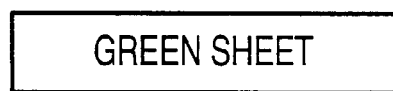
FIG. 17A is a view showing a step in a manufacturing process of the eighth embodiment of the ceramic package in the present invention.
Figure 17B:
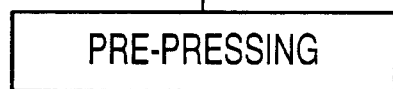
FIG. 17B is a view showing another step in the manufacturing process of the eighth embodiment of the ceramic package in the present invention.
Figure 17C:
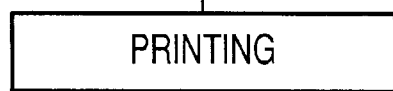
FIG. 17C is a view showing still another step in the manufacturing process of the eighth embodiment of the ceramic package in the present invention.

As shown in FIGS. 17A to 17J, the manufacturing step in the eighth embodiment is basically similar to that of the conventional ceramic package. At first, a predetermined green sheet is prepared (FIG. 17A). This green sheet is pre-pressed (FIG. 17B). The alloy of silver and palladium is printed on element hardened to some extent by the pre-press (FIG. 17C). This alloy of silver and palladium later serves as the inner electrode or the bedding layer of the outer electrode.

Figure 17D:
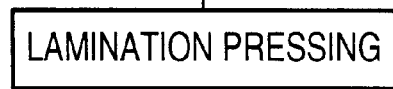
FIG. 17D is a view showing still another step in the manufacturing process of the eighth embodiment of the ceramic package in the present invention.
Figure 17E:
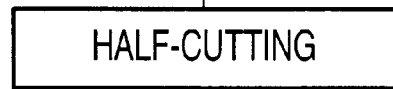
FIG. 17E is a view showing still another step in the manufacturing process of the eighth embodiment of the ceramic package in the present invention.

Next, a plurality of layers are laminated, and lamination press is carried out (FIG. 17D). This lamination press is usually carried out by using the CIP as mentioned above. Until this stage, as a general, several hundreds of devices are formed on one green sheet with a large green sheet as a substrate. A half-cut process is performed on the green sheet after the lamination press so that the several hundreds of devices formed on the green sheet can be later separated into individual devices (FIG. 17E). The half-cut process implies that a groove having a predetermined depth is formed in advance on the green sheet.

Figure 17F:
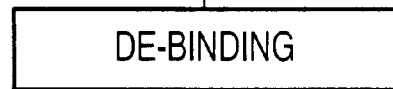
FIG. 17F is a view showing still another step in the manufacturing process of the eighth embodiment of the ceramic package in the present invention.
Figure 17G:
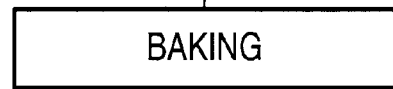
FIG. 17G is a view showing still another step in the manufacturing process of the eighth embodiment of the ceramic package in the present invention.
Figure 17H:
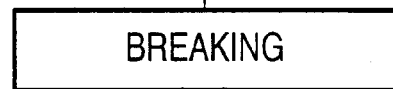
FIG. 17H is a view showing still another step in the manufacturing process of the eighth embodiment of the ceramic package in the present invention.

Next, de-binder is carried out (FIG. 17F). The de-binder is a step of shooting the binder of the ceramic intermediate body on which the lamination press is performed. This is a front step of a baking step (FIG. 17G). Next, the baking is carried out so that it is in a substantially completed state. Force is applied to the portion where the groove is formed by the previous half-cut to then break each ceramic package (FIG. 17H). In the broken ceramic package, both the inner electrode and the outer electrode are made of the alloy of silver and palladium until this stage. Then, activation process is carried out (FIG. 17I) for the sake of plating such that the surface of the outer electrode is composed of the gold (FIG. 17J).

This activation process is carried out by immersing this intermediate body in palladium solution. At this time, it is necessary that in the inner electrode, the alloy of silver and palladium is left as it is. Thus, for example, resist is coated on the top surface of the inner electrode so that the plating is not carried out. After the activation, the palladium is exposed on the surface of the alloy of silver and palladium in the portion where the outer electrode should be formed. This exposed palladium is plated with nickel by electroless plating. Then, the plated portion is further plated with gold by electroless plating.

As mentioned above, the inner electrode and the outer electrode are plated. Accordingly, the inner electrode is composed of the alloy of silver and palladium. In the outer electrode, the lowest bedding layer is composed of the alloy of silver and palladium, a layer on the lowest bedding layer is composed of the nickel, and a further layer thereon is composed of the gold. In this way, the eighth embodiment is completed. In addition, it is necessary to remove the resist coated on the surface of the inner electrode by acetone cleaning, asher or the like, after the final plating.

Moreover, the formation of the electrode in the eighth embodiment will be described below with reference to FIG. 18.

Figure 17I:
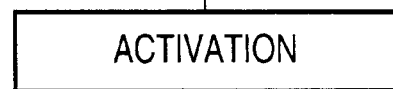
FIG. 17I is a view showing still another step in the manufacturing process of the eighth embodiment of the ceramic package in the present invention.
Figure 17J:
FIG. 17J is a view showing still another step in the manufacturing process of the eighth embodiment of the ceramic package in the present invention.
Figure 18:
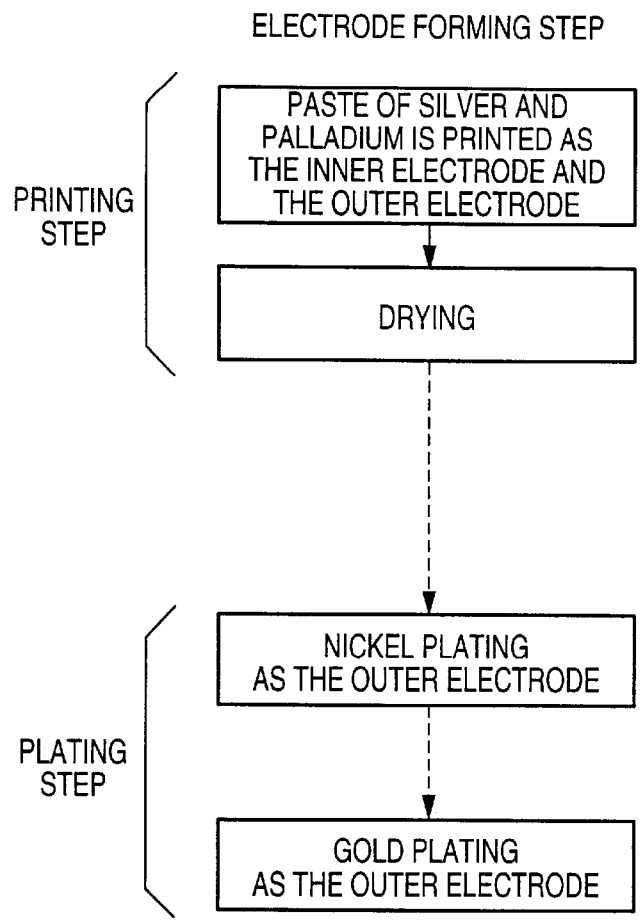
FIG. 18 is a view showing a step of forming an electrode in the eighth embodiment of the ceramic package in the present invention.

As shown in FIG. 18, the inner electrode and the outer electrode are formed in the printing step of FIG. 17C and the plating step of FIG. 17J. In the printing step, silver-palladium paste is printed as the inner electrode and the outer electrode. Since the thus-printed silver-palladium paste is still soft in this condition, drying it makes it in some degree of hardness.

Then, after the printing step (FIG. 17C), the operational flow ends the lamination press (FIG. 17D), the half-cut (FIG. 17E), the de-binder (FIG. 17F), the baking (FIG. 17G), the breaking (FIG. 17H) and the activation (FIG. 17I). Then, it proceeds to the plating step (FIG. 17J). In the plating step, the nickel plating and the gold plating are carried out as the outer electrode, as shown in FIG. 18. At this time, as mentioned above, the inner electrode is covered with the resist and the like so that the nickel and the gold are not precipitated. Through such steps, the inner electrode and the outer electrode are formed as shown in FIG. 19.

Figure 19:
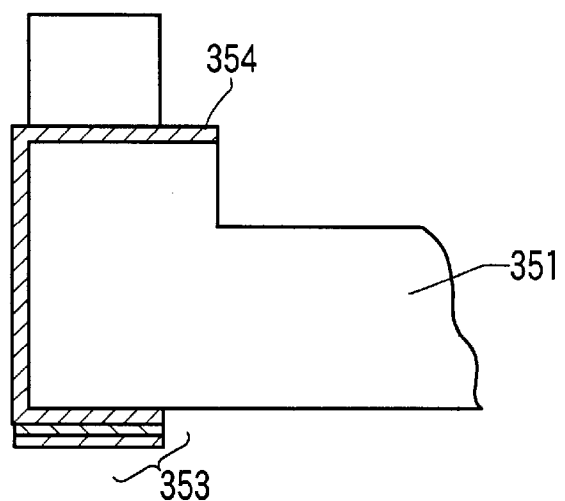
FIG. 19 is an enlarged section view showing an electrode portion in a ninth embodiment of the ceramic package in the present invention.

FIG. 19 enlarges and shows a section of an electrode portion of a base 351 in the ceramic package according to the eighth embodiment. Material composed of silver and palladium is exposed on the inner electrode 354. On the outer electrode 353, the silver palladium is plated with the nickel, and the portion on the nickel-plated portion is further plated with the gold. If so, since the silver palladium is very compatible with the conductive adhesive as mentioned above, it is possible to ensure the sufficient bonding strength and conductivity to sufficiently insure the mechanical strength.

In the outer electrode, it is the gold that is finally exposed on the surface. The gold is superior in plating adhesion performance, and the nickel positioned thereunder is superior in plating heat resistance. Thus, the excellent plating can be carried out in any case of the reflow plating and the dip plating. In addition, as the ceramic that is the material used in the eighth embodiment, it is possible to use element such as glass ceramic whose thermal expansion coefficient coincides with that of the electronic device hermetically enclosed within this ceramic package, in addition to the ceramic material which uses as the base the alumina explained in the conventional technique and the like.

For example, if manufacturing the ceramic package for enclosing the quartz oscillator as the electronic device, it is desirable to use the glass ceramic as the ceramic material constituting the ceramic package. This reason is that it is possible to attain the thermal expansion coefficient of about 100 to $150 \times 10^{-7}$ which coincides with that of the quartz oscillator. The glass ceramic is the composite material of glass and ceramic in which, for example, the forsterite is dispersed in the glass by 30 to 70 weight %.

By dispersing in the glass the forsterite by 30 to 70 weight % as mentioned above, the thermal expansion coefficient can be adjusted to about 100 to $150 \times 10^{-7}$. Moreover, as the composition of the glass, it is further desirable that $SiO_2$ is 50 to 70 weight %, $Al_2O_3$ is 2 to 15 weight %, ZnO is 2 to 15 weight %, oxide of potassium, strontium, barium and the like is 5 to 30 weight %, $B_2O_3$ is 1 to 8 weight % and oxide of sodium and potassium is 5 to 30 weight %.

In order to improve the mechanical strength, for example, the bending strength to the necessary strength, it is desirable to use element in which the average particle diameters of the glass and the ceramic are sufficiently reduced up to about 1 to 3 microns. In addition, if the bending strength is especially needed, it is known that the average particle diameter of the ceramic is effectively set to about 0.5 microns. As another method of further improving the bending strength, there is a method of mixing this glass with one or more elements of $ZnO_2$, $SnO_2$, $P_2O_5$ and $MoO_2$ by 0.2 to 5 weight % to then crystallize the glass at the time of baking.

The utilization of the ceramic material having the above-mentioned composition to the ceramic package in the eighth embodiment enables the thermal expansion coefficients of a piezoelectric part, such as a quartz plate and the like, the quartz oscillator and other electronic devices to coincide with the thermal expansion coefficient of the ceramic package. Accordingly, even the thermal expansion occurring when the soldering is carried out, or the thermal expansion occurring when the cover is placed on the base of the ceramic package with the glass enclosing does not cause the stress to stay in the electronic device enclosed therein. Thus, the performance measured for the electronic device itself can be kept as it is after packaging.

A method of configuring raw material of this glass ceramic material is described. The glass ceramic is pulverized with the ball mill. After it is dried, the powder press is performed on it. Then, it is baked at 800° C. to 1000. The baked element is cut to the rectangular parallelepiped. Then, the bending strength and the thermal expansion coefficient are measured. Only the samples having the sufficiently excellent result are selected to then put to actual product. The thermal expansion coefficient of the element in which the glass, the forsterite and the like are minutely pulverized and mixed with each other as shown in the present invention is about 100 to $140 \times 17^{-7}$, and sufficiently large. Thus, it is the that this is the material suitable for the quartz oscillator and the like, as compared with the ceramic package which uses the conventional alumina and the like as the raw material.

In a case of mixture of zirconia, it is known that a bending strength thereof is 2200 kg/cm² or more and it can be improved to 3000 kg/cm² or more, depending on the composition thereof. It is also confirmed that element where the zirconia is added and baked is partially crystallized as the results of differential thermal analysis and X-ray analysis. That is, the zirconia functions as core generator.

As mentioned above, the eighth embodiment is the ceramic package in which the respective surfaces of the inner electrode and the outer electrode linked to this inner electrode are composed of the alloy of silver and palladium and the gold. Such configuration enables the electronic device hermetically enclosed within the ceramic package to be fixed under the sufficient strength. Moreover, the solderability and the solder heat resistance are high when this ceramic package is placed on the circuit board serving as the mother board. The utilization of the above-mentioned material can solve the problem with regard to the thermal stress given to the electronic device enclosed within the ceramic package. Thus, this can provide the extremely excellent ceramic package and ceramic package type electronic part which have the high strength and the high reliability.

A ninth embodiment will be described below with reference to FIGS. 22A and 22B. The ninth embodiment is a ceramic package, in which the outer electrode in the eighth embodiment is provided with a side electrode positioned on a side of the base and a bottom surface electrode positioned on a bottom surface of the base. While the outer electrode is typically positioned on a bottom surface of an electronic part, the outer electrode is provided even on the side in the condition that it is linked to the bottom surface in series, in the ninth embodiment.

Figure 20A:
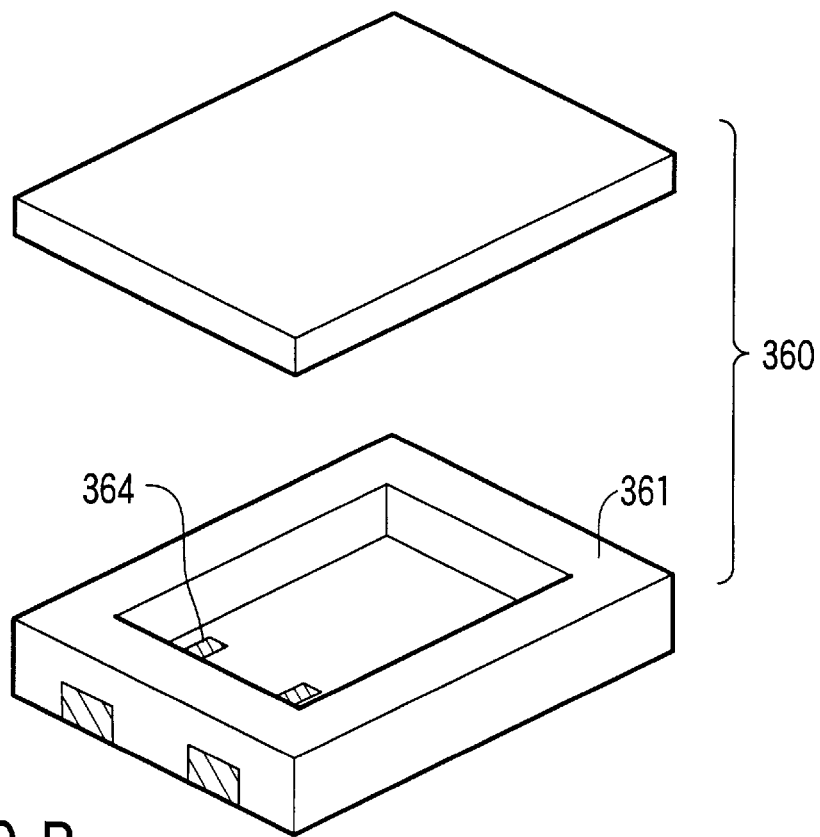
FIG. 20A is an exploded perspective view showing the ninth embodiment of the ceramic package in the present invention.
Figure 20B:
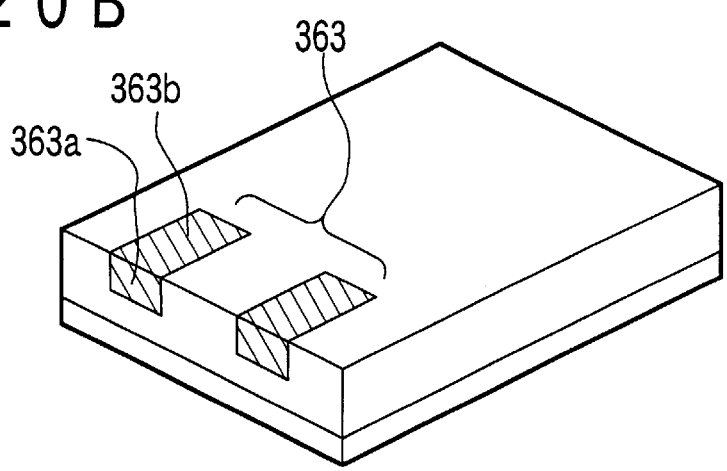
FIG. 20B is a rear view showing the ninth embodiment of the ceramic package in the present invention.

As shown in FIGS. 20A and 20B, an outer electrode 363 linked to an inner electrode 364 is spread from a part of a side of a base 361 of a ceramic package 360 to a bottom surface. The portion of the side is referred to as a side electrode 363a, and the portion of the bottom surface is referred to as a bottom surface electrode 363b. This arrangement of the electrodes on the side and the bottom surface makes a free degree higher at a time of insertion into the circuit board serving as the mother board. Hence, the fixing strength at a time of soldering becomes sufficiently strong.

Figure 21:
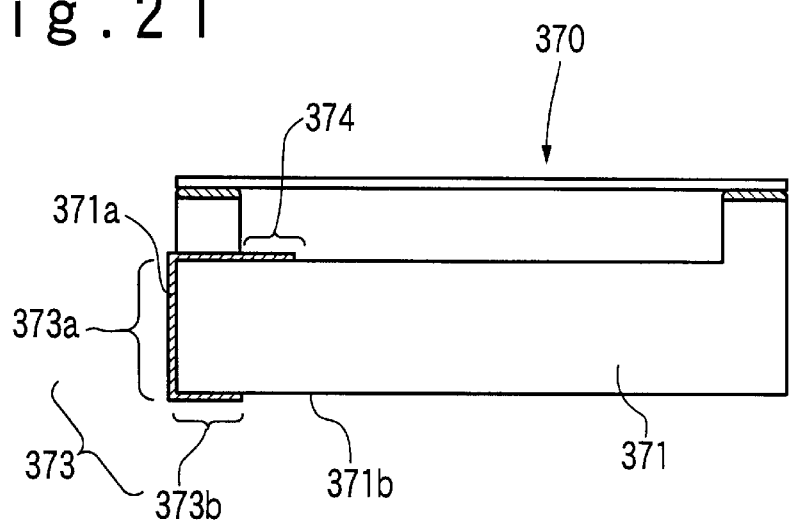
FIG. 21 is a side section view showing the ninth embodiment of the ceramic package in the present invention.

FIG. 21 is a section view of the electrode of the ceramic package shown in FIGS. 20A and 20B. As shown in FIG. 21, there are an inner electrode 374 and an outer electrode 373 linked thereto. The inner electrode 374 penetrates a part of a wall of a base 371 of a ceramic package 370, and is externally exposed, and then becomes the outer electrode 373. In the outer electrode 373, the externally exposed portion goes along a side surface 371a of the base 371 of the ceramic package 370 and then goes into a bottom surface 371b of the base 371. That is, in the outer electrode 373, the portion of the side surface 371a is a side electrode 373a, and the portion of the bottom surface 371b is a bottom surface electrode 373b.

The ninth embodiment is based on the eighth embodiment, as a general. The inner electrode and the outer electrode are similar to those of the eighth embodiment. That is, the surface of the inner electrode is made of the alloy of silver and palladium, and the respective surfaces of the side electrode and the bottom surface electrode in the outer electrode are both made of the gold. FIGS. 22A and 22B show the situation that the ninth embodiment is positioned on the circuit board.

Figure 22A:
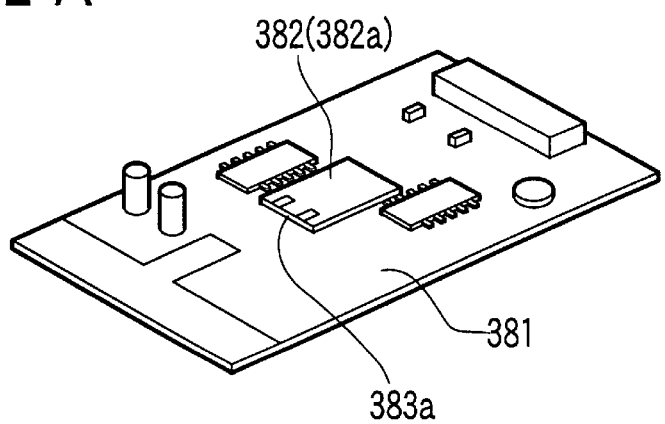
FIG. 22A is a perspective view showing a utilization example in the ninth embodiment of the ceramic package in the present invention.

FIG. 22A shows the situation that the bottom surface of a ceramic package 382 (382a) is put toward and adhered onto a circuit board 381. In the situation of FIG. 22A, it occupies a wide area on the circuit board 381. Thus, the situation of FIG. 22A results in a problem if a large number of circuits must be formed on a predetermined area, for example, if a plurality of ceramic packages 382a or ceramic package type electronic parts 382 must be arranged on a narrow area. In this case, as shown in FIG. 22B, a side electrode 383a is used and then the plurality of ceramic packages 382a or ceramic package type electronic parts 382 are longitudinally arranged to thereby reduce the arrangement area of the ceramic packages 382a or the ceramic package type electronic parts 382 occupying the circuit board 381 and also enable the high dense mounting.

Figure 22B:
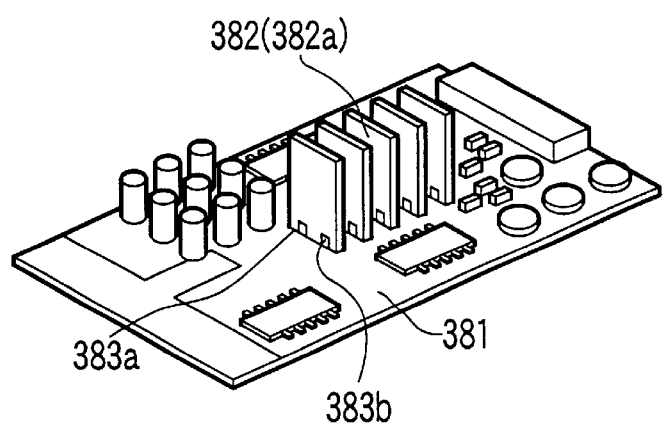
FIG. 22B is a perspective view showing another utilization example in the ninth embodiment of the ceramic package in the present invention.

Incidentally, the ninth embodiment is not always limited to the utilization shown in FIG. 22B. Even in the utilization case shown in FIG. 22A, the fixing strength fixed on the mother board can be made very strong by making the solder protuberant on the circuit board 381 and then fixing the bottom electrode 383b as well as the side surface electrode 383a through the solder.

As mentioned in the eighth embodiment, the surface of the soldered electrode is made of the gold, and the portion thereunder is made of the nickel. Thus, the solderability and the solder heat resistance are high. The more above-mentioned portions there are exposed on the surface of the ceramic package, the stronger the bonding strength onto the circuit board of the ceramic package if the portion is bonded through the solder. The ninth embodiment has effect also from such standpoint.

A tenth embodiment will be described below with reference to FIGS. 23 to 24F. The tenth embodiment is a ceramic package in which a part of the side electrode in the ninth embodiment is stuck from the side of the base into the inside thereof. The tenth embodiment has the configuration similar to those of the eighth and ninth embodiments, and further a part of the side electrode is stuck from the side of the base into the inside thereof.

Figure 23:
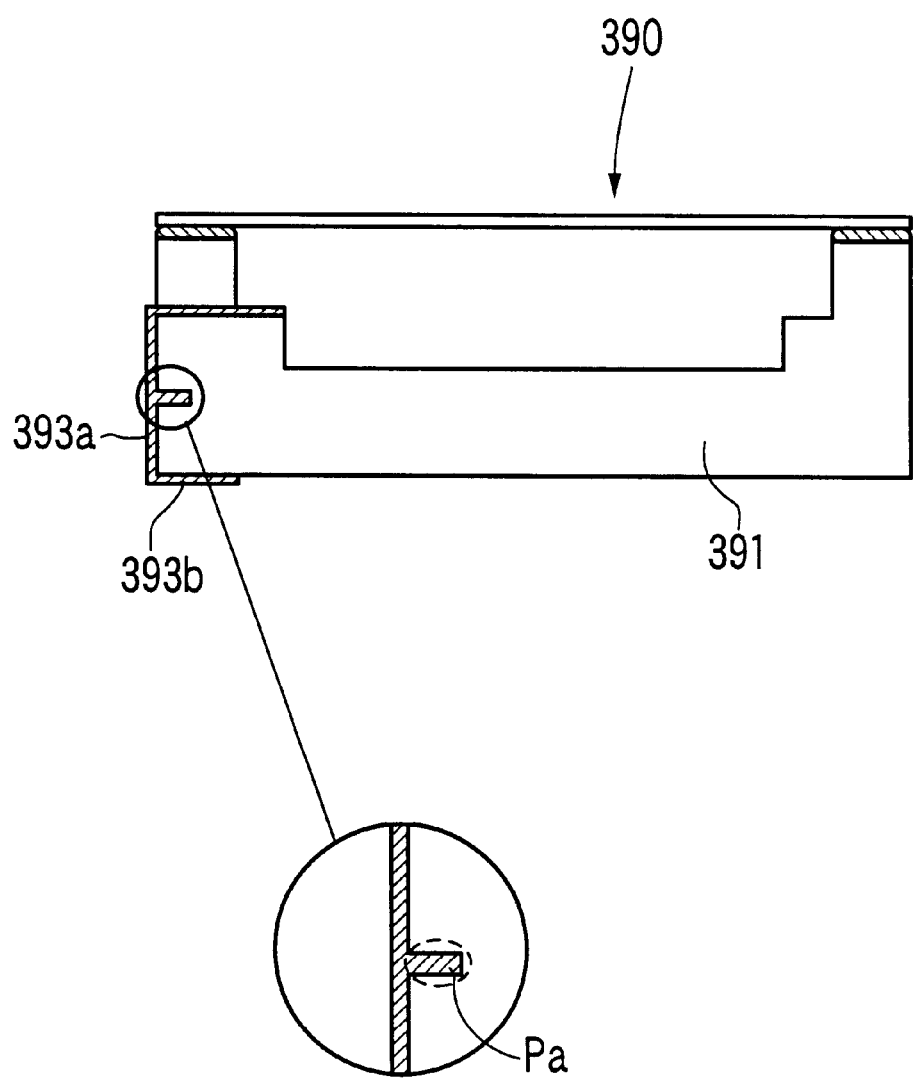
FIG. 23 is a section view showing a tenth embodiment of the ceramic package in the present invention.

As shown in FIG. 23, in a side electrode 393a, a part Pa of a center thereof is T-shaped and stuck into a base 391 of a ceramic package 390, as shown in a circular enlarged view of FIG. 23. Accordingly, this improves the bonding strength of the side electrode 393a to the base 391. Typically, the base of the ceramic package is made of the ceramic material, and the side electrode formed on the side of this base is composed of metal and oxide. Thus, there is a large difference in thermal expansion coefficient between the base and the side electrode formed on the base. Hence, large stress stays in the portion because of a high temperature at the time of soldering or a high temperature when a cover is sealed with glass.

Thus, there may be a case that the side electrode is stripped from this boundary. With regard to this problem, if the part Pa of the side electrode is stuck into the inside as in the tenth embodiment, the side electrode is reinforced in this portion, and thereby it is not easily stripped. Especially if the part Pa of the side electrode is stuck from the side of the base into the inside thereof, the strength is sufficiently strong even when a large quantity of solder is adhered to the stuck portion. Hence, this can protect the strip of the side electrode resulting from the thermal stress. A method of forming this side electrode is described with reference to FIGS. 24A to 24F.

Figure 24A:
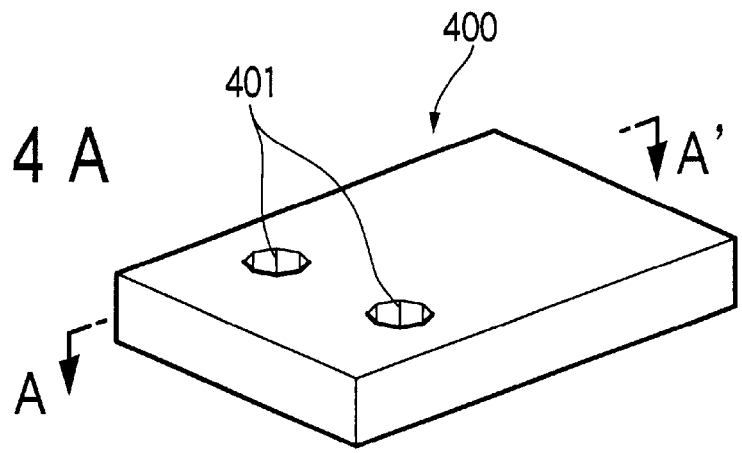
FIG. 24A is a view showing a step in a manufacturing process of the tenth embodiment of the ceramic package in the present invention.
Figure 24B:
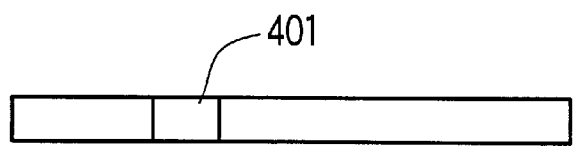
FIG. 24B is a view showing another step in the manufacturing process of the tenth embodiment of the ceramic package in the present invention.
Figure 24C:
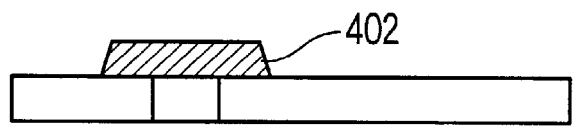
FIG. 24C is a view showing still another step in the manufacturing process of the tenth embodiment of the ceramic package in the present invention.
Figure 24D:
FIG. 24D is a view showing still another step in the manufacturing process of the tenth embodiment of the ceramic package in the present invention.

At first, FIG. 24A shows the situation of a green sheet 400 on which a side electrode is formed. As shown in FIGS. 24A and 24B, a through hole 401 is formed on the portion on which the side electrode is formed. Paste of silver and palladium 402 is coated on this through hole 401 (FIG. 24C), and the coated paste is sucked from a bottom surface side of the through hole (FIG. 24D). Accordingly, the through hole 401 is filled with the silver-palladium paste such that the silver-palladium paste is sucked into the through hole 401 since it is soft (FIG. 24D). At the stage that the through hole 401 is filled with the silver palladium as mentioned above, the silver-palladium paste becomes the silver palladium after drying and heating. The side electrode 403a is formed by cutting a central portion of the through hole 401 (FIG. 24F).

Figure 24E:
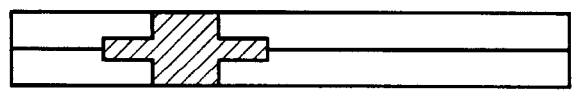
FIG. 24E is a view showing still another step in the manufacturing process of the tenth embodiment of the ceramic package in the present invention.
Figure 24F:
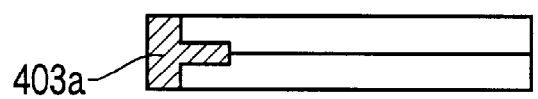
FIG. 24F is a view showing still another step in the manufacturing process of the tenth embodiment of the ceramic package in the present invention.

Element shown in FIG. 24E is created by piling up two T-shaped components shown in FIG. 24D. The side electrode 403a in the tenth embodiment is attained by cutting the ceramic intermediate body having the two piled T-shaped components.

Incidentally, FIGS. 24A to 24F show the method of manufacturing only the side electrode 403a in which a part of the side electrode 403a is stuck from the side of the base into the inside thereof. Thus, the method of manufacturing the tenth embodiment is not limited to it.

An eleventh embodiment will be described below with reference to FIGS. 25A to 26. In the eleventh embodiment, the side electrode is positioned in a concave portion disposed on the side of the base. When the side electrode is fixed through the solder on the circuit board serving as the mother board as mentioned above, the side electrode is effective in increasing the variation of the method of mounting it and further strengthening the fixing strength to the solder. In the eleventh embodiment, the side electrode is positioned on the concave portion disposed on the side of the base.

If the side electrode is positioned in the concave portion as mentioned above, when this portion is filled with the solder, the bonding area between the solder and this ceramic package is made further wider. Moreover, as for the side electrode disposed in this concave portion, a plurality of sides are fixed with walls of the ceramic package. Thus, the bonding strength is made further stronger.

Figure 25A:
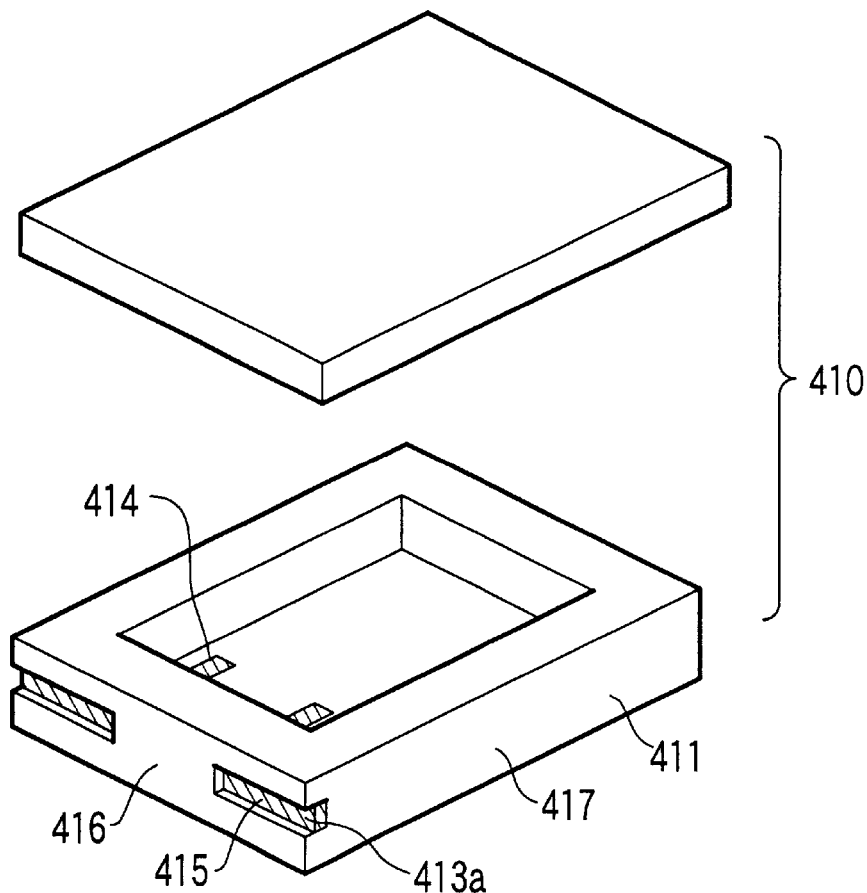
FIG. 25A is an exploded perspective view showing an eleventh embodiment of the ceramic package in the present invention.
Figure 25B:
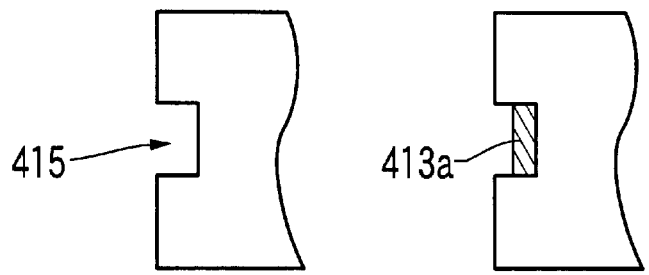
FIG. 25B is an enlarged section view showing a main portion of the eleventh embodiment of the ceramic package in the present invention.

In this case, the concave portion 415 disposed on the side of the base 411 can be disposed on a short side 416 of the base 411 in a horizontally directed state, as shown in FIGS. 25A and 25B. Also, the concave portion 415 disposed on the side of the base 411 can be disposed on a long side 417 of the base 411 in a horizontally directed state, as shown in FIG. 26.

Figure 26:
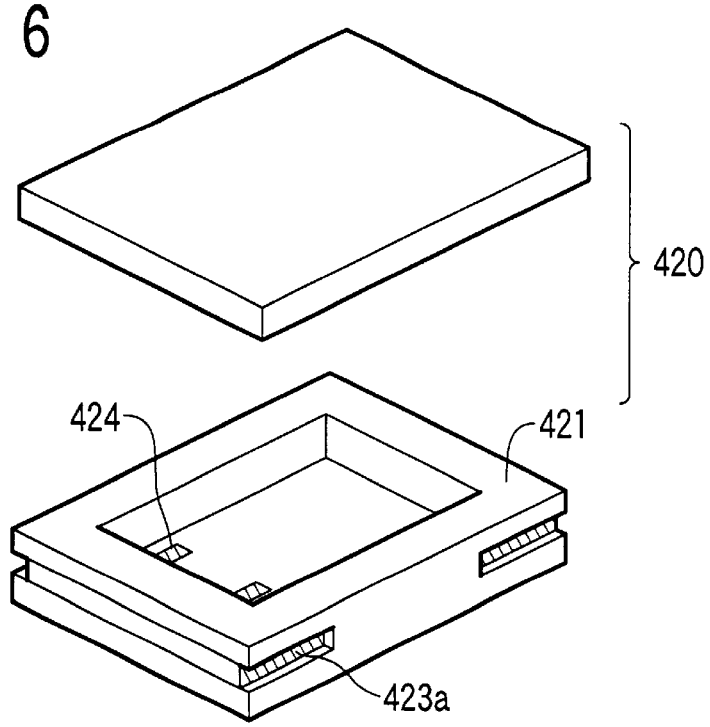
FIG. 26 is an exploded perspective view showing a variation example in the eleventh embodiment of the ceramic package in the present invention.

Moreover, the concave portion disposed on the side of the base may have any configuration other than the configurations shown in FIGS. 25A, 25B and 26. It is not always necessary that the concave portion is arranged parallel to the bottom surface and the top surface of the base. Of course, the concave portion may be obliquely positioned. Also, it is not limited to the rectangular concave portion, and it may be an ellipsoidal or circular concave portion.

Since the side electrode is disposed in the concave portion, the bonding strength itself of the side electrode is improved. If the side electrode within the concave portion is connected through the solder to a printed circuit board, the bonding strength is improved between the side of the ceramic package and the solder. The bonding strength to the printed circuit board serving as the mother board of the ceramic package is improved as a whole, from these two points. FIG. 25A is an exploded perspective view of a ceramic package 410 in the eleventh embodiment. A symbol 414 denotes an inner electrode. FIG. 25B partially enlarges and shows a side electrode 413a disposed in a concave portion and a concave portion 415. FIG. 26 is an exploded perspective view of a ceramic package 420, and shows a side electrode 423a disposed in a base 421. A symbol 424 denotes an inner electrode.

Figure 27:
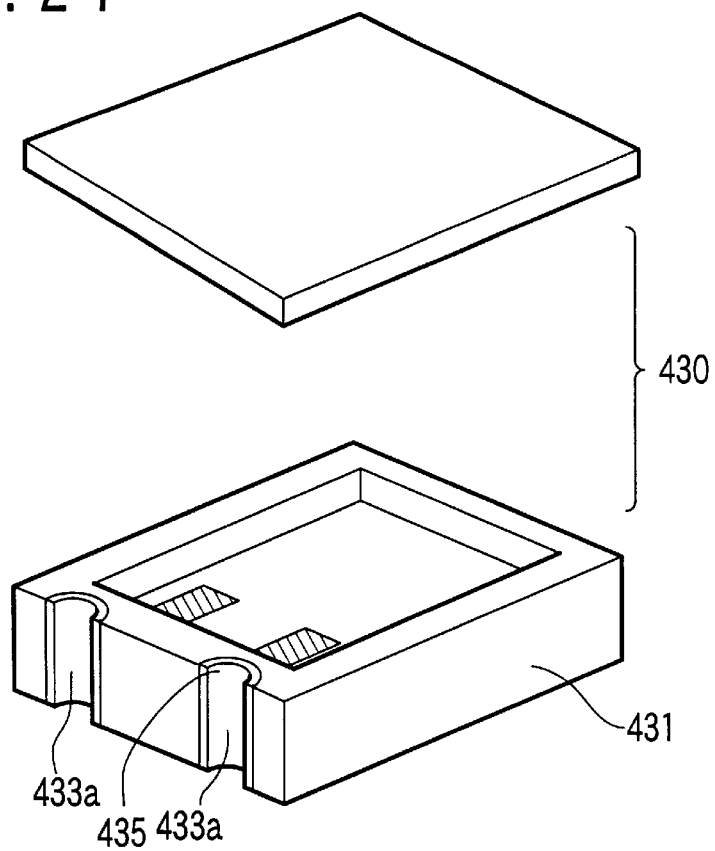
FIG. 27 is an exploded perspective view showing a twelfth embodiment of the ceramic package in the present invention.

A twelfth embodiment will be described below. In the twelfth embodiment, the concave portion in the eleventh embodiment is a longitudinal groove disposed on the side of the base. In the eleventh embodiment, the concave portion is illustrated in the situation directed horizontally to the bottom surface of the ceramic package. On the contrary, in the twelfth embodiment, a concave portion 435 disposed in a ceramic package 430 is limited to the longitudinal groove, as shown in FIG. 27. The reason why it is limited to the longitudinal groove is that the longitudinal groove enables the solder to easily go along this concave portion 435 and rise up, and as a result, the solder is easily adhered to a side electrode 433a disposed on the side of the ceramic package 430.

Especially, the following effect can be obtained if the concave portion 435 is formed in a thin size to such a degree that capillarity can act. In the case of the re-flow soldering method, even if cream solder is slightly placed on the circuit board, when the cream solder is fused, it goes along the concave portion 435 and rises up. Then, the whole side electrode 433a is fixed in a condition that it is filled with the fused solder. Accordingly, the ceramic package with the sufficient bonding strength can be obtained by the simple method.

Figure 28:
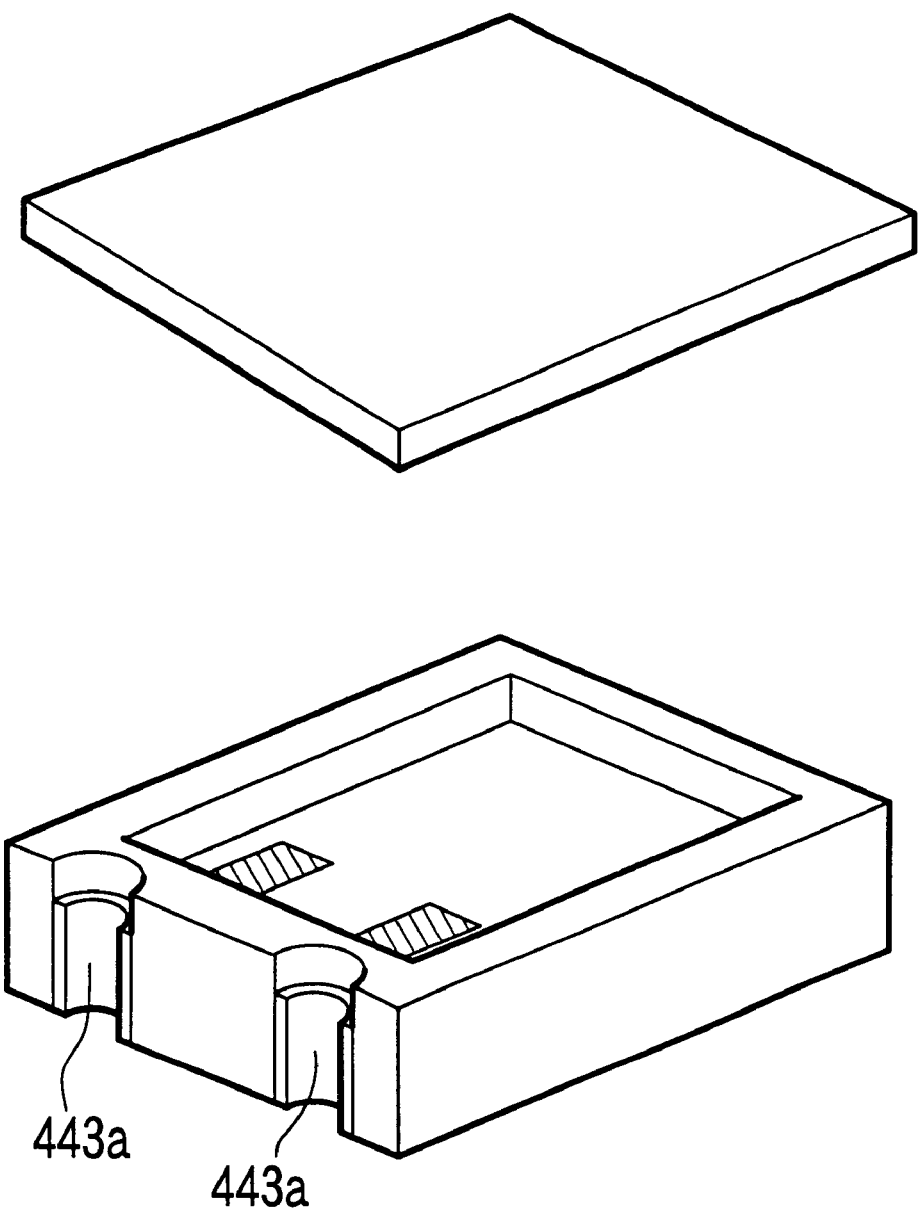
FIG. 28 is an exploded perspective view showing a variation example in the twelfth embodiment of the ceramic package in the present invention.

In addition, the side electrode 433a disposed in this concave portion 435 may be entirely positioned from an upper portion of the groove in the concave portion 435 on the side of a base 431 to a lower portion thereof, as shown in FIG. 27. Also, a side electrode 443a may be partially formed from a part of the concave portion, namely, a middle portion thereof to a side of a bottom surface electrode, as shown in FIG. 28A.

Figure 29A:
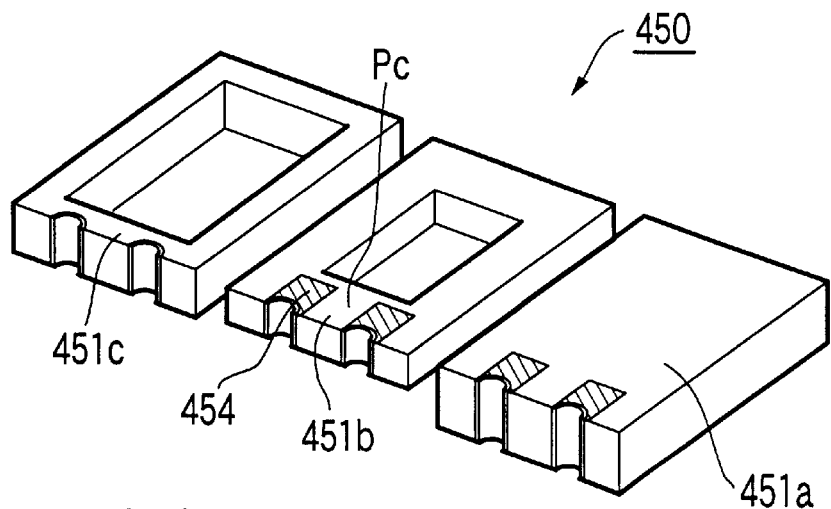
FIG. 29A is an exploded perspective view showing the variation example in the twelfth embodiment of the ceramic package in the present invention.
Figure 29B:
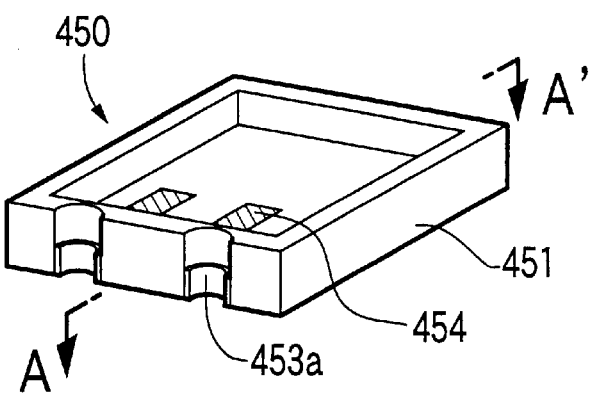
FIG. 29B is a perspective view showing the variation example in the twelfth embodiment of the ceramic package in the present invention.

A process of manufacturing the twelfth embodiment will be described below with reference to FIGS. 29A to 29C. An element jointly having the advantageous points in the eighth to twelfth embodiments is described in FIG. 29A. At first, this ceramic package 450 is created by piling up intermediate bodies 451a to 451c in a three-layer configuration, as shown in FIG. 29A. Among the three intermediate bodies 451a to 451c, the intermediate body 451a is piled on the lowest portion, the intermediate body 451b is piled on the intermediate body 451a, and the intermediate body 451c is piled on the intermediate body 451b.

The intermediate body 451c of the ceramic package positioned on a top layer (a first layer) is frame-shaped. The side electrode is formed on the side portion of the intermediate body 451c of the ceramic package. However, the silver palladium and other metal wiring are not performed on the portion on which the side electrode is formed.

Next, in the intermediate body 451b of the ceramic package corresponding to a second layer, a portion Pc corresponding to one side of the frame is formed thicker than that of the intermediate body 451c of the first layer. An inner electrode 454 formed on the thicker portion Pc of the intermediate body 451b is exposed from the intermediate body 451c. The side electrode linked to an outer electrode is positioned on a concave portion of the side on the intermediate body 451b, namely, the portion serving as the longitudinal groove.

In addition, in the intermediate body 451b of the second layer, a rear surface thereof is formed substantially identically to a front surface thereof although it is not shown. A part of the side electrode 453a also goes into the rear side as the inner electrode.

The intermediate body 451a corresponding to a third layer is formed in a form of flat plate. A groove is disposed on the side thereof, similarly to the intermediate body 451b. The groove is covered with metal, such as silver, palladium and the like, serving as the side electrode 453a, and further a part of the electrode is spread from the side to the top surface.

The bottom surface of the third layer is a portion serving as a bedding layer constituting the bottom surface electrode. The alloy of silver, palladium and the like is spread even in that portion as the substrate of the bottom surface electrode.

Figure 29C:
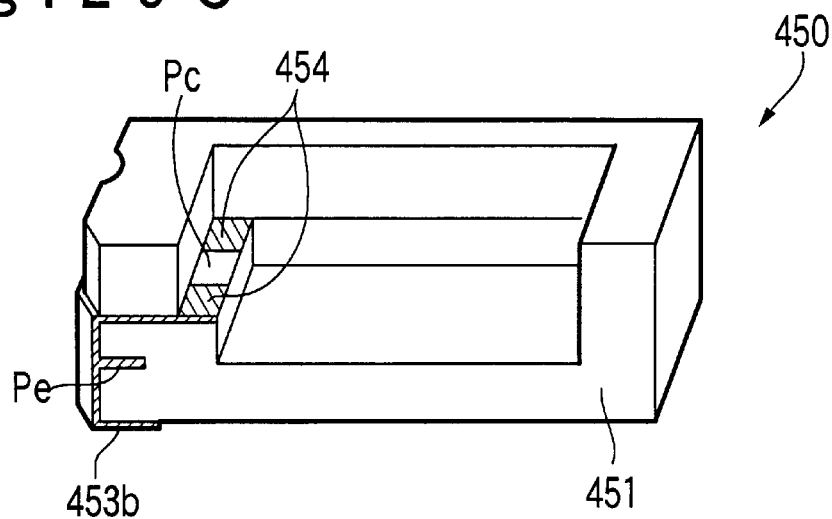
FIG. 29C is a section view showing the variation example in the twelfth embodiment of the ceramic package in the present invention.

These three first, second and third layers are piled up to accordingly create a ceramic package 450 shown in FIG. 29C. FIG. 29B shows a section of an electrode portion in the ceramic package 450. As shown in FIG. 29C, an inner electrode 454 is positioned on a side (a left side in FIG. 29C) on which a concave portion within cavity in the ceramic package 450 is formed. The inner electrode 454 is formed on a top surface of a stepped portion (a protrusion) Pc within the cavity. The side electrode 453a is linked to the inner electrode 454. A part Pe of the side electrode 453a is stuck into the base 451 of the ceramic package 450.

The portion Pe stuck into this base is formed in a piled portion by piling up the intermediate bodies 451b, 451a in the second and third layers. The side electrode 453a is passed through this stuck portion Pe and passed to the bottom surface side of the base 451, and accordingly a bottom surface electrode 453b is formed on the bottom surface of the base 451. In this way, the side electrode 453a is passed around so as to form the longitudinal grooves in the respective intermediate bodies 451a to 451c in the first, second and third layers and also form the side electrode 453a in the longitudinal groove portion and further form the portion Pe stuck into the inside.

The longitudinal grooves are disposed on the side of the base as in the twelfth embodiment by piling up the three intermediate bodies 451a to 451c. Also, the electrode (side electrode 453a) is formed on the concave portion as in the eleventh embodiment. Then, the ceramic package 450 is completed in which the side electrode 453a is stuck into the base 451.

Figure 30A:
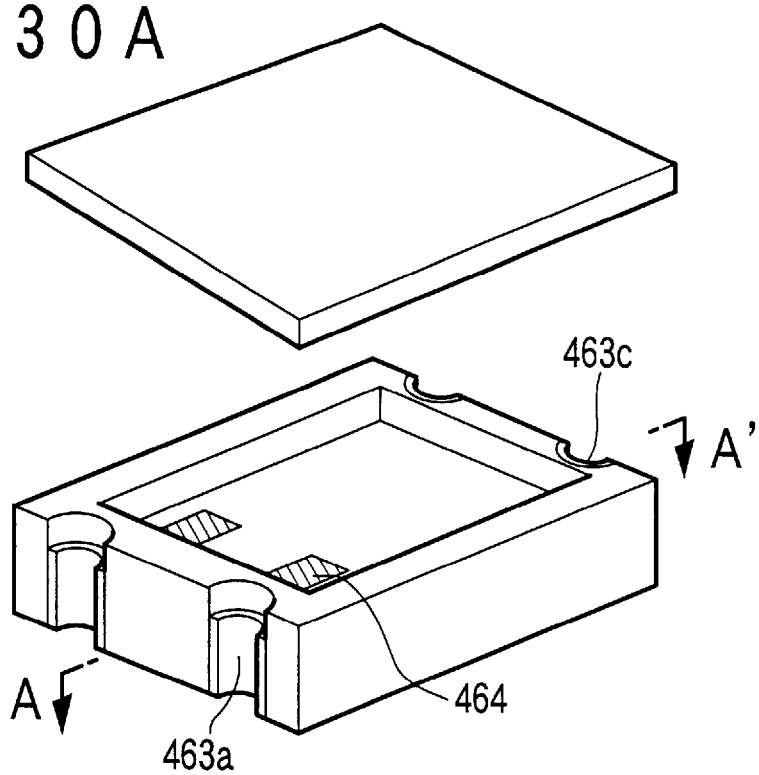
FIG. 30A is an exploded perspective view showing a thirteenth embodiment of the ceramic package in the present invention.

A thirteenth embodiment will be described below with reference to FIGS. 30A and 30B. In the thirteenth embodiment, a dummy side electrode which is not linked to the inner electrode is disposed in the concave portion. As mentioned above, the surface of (the outer electrode of) this type ceramic package is made of the gold, and the bedding layer thereof is also made of the nickel. Thus, the bonding strength to the solder is extremely high.

Thus, from the viewpoint that this ceramic package is fixed on the circuit board, it is not always necessary that the metal portion exposed on this side is the outer electrode linked to the inner electrode. It may be the dummy side which does not perform the function as the electrode. It is possible to mount the dummy side electrode to thereby fix this dummy side electrode through the solder. Hence, the mount with the further stronger fixing strength is possible as compared with the case in which only the original outer electrode merely linked to the inner electrode is fixed on the circuit board through the solder.

Figure 30B:
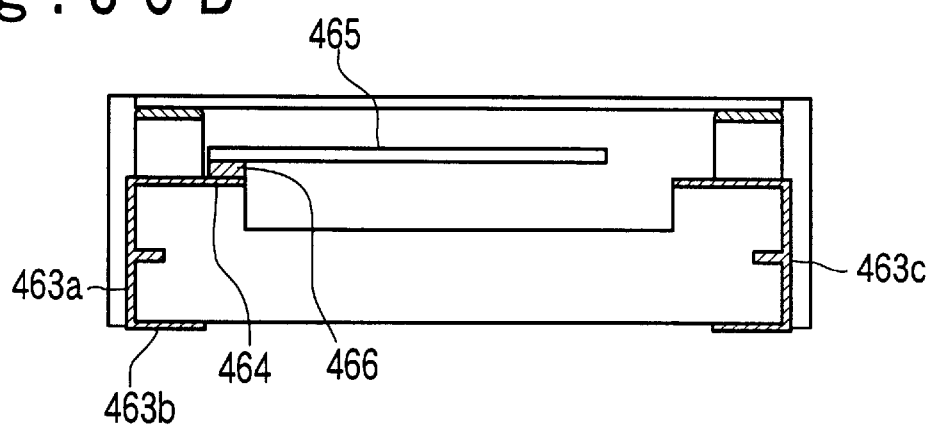
FIG. 30B is a side section view showing the thirteenth embodiment of the ceramic package in the present invention.

FIG. 30B is a section view of a portion including a dummy side electrode 463c. As shown in FIG. 30B, an electronic device 465 is linked through a conductive adhesive 466 to an inner electrode 464. This inner electrode 464 appears on the side and is then linked to a side electrode 463a, and further linked to a bottom surface electrode 463b over the bottom surface. The dummy side electrode 463c shown on a right side of FIG. 30B is not linked to any of the inner electrode 464 and the electronic device 465.

However, this dummy side electrode 463c is made of metal which is strong in bonding strength to solder. That is, the surface of the dummy side electrode 463c is made of the gold, and the bedding layer thereof is made of the nickel. Thus, as mentioned above, it is possible to fix the ceramic package or the ceramic package type electronic part with the strong solder fixing strength and the high reliability when it is mounted on the circuit board. In addition, another special step is not necessary when this dummy side electrode 463c is manufactured. So, it can be formed in the forming order similar to that of the original side electrode 463a. Hence, the manufacturing step is not complex, as compared with the conventional technique.

Figure 31:
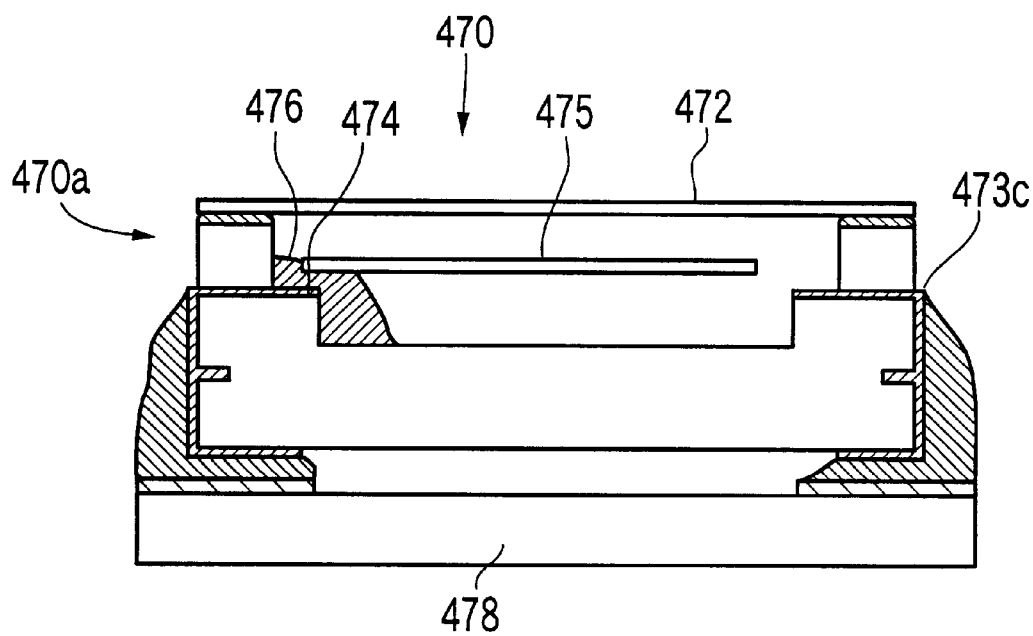
FIG. 31 is a side section view showing a fourteenth embodiment of the ceramic package in the present invention.

A fourteenth embodiment will be described below. In the fourteenth embodiment, the electronic device in the eighth to thirteenth embodiments is fixed with the conductive adhesive to the inner electrode. As shown in FIG. 31, the action effect in the eighth to thirteenth embodiments is provided by fixing the electronic device 475 inside the ceramic package 470a through a conductive adhesive 476. Thus, the fourteenth embodiment is proposed from such standpoint. So, it is a ceramic package type electronic part 470 according to the eighth to thirteenth embodiments for fixing an electronic device 475 in an inner electrode 474 with the conductive adhesive 476. A symbol 473c denotes a dummy side electrode, a symbol 478 denotes a circuit board, and a symbol 472 denotes a cover.

A fifteenth or sixteenth embodiment will be described below. The fifteenth embodiment is a ceramic package according to the eighth to thirteenth embodiments, in which the concave portion is filled with the solder, and when it is placed and fixed on the circuit board, it is heated, and thereby the solder is fused, and accordingly it is fixed on the circuit board through the solder. The sixteenth embodiment is a ceramic package type electronic part according to the fourteenth embodiment, in which the concave portion is filled with the solder, and when it is placed and fixed on the circuit board, it is heated, and thereby the solder is fused, and accordingly it is fixed on the circuit board through the solder.

In the fifteenth or sixteenth embodiment, the solder is in advance filled into the above-mentioned concave portion, namely, the concave portion disposed on the base side. Thus, the ceramic package type electronic part can be fixed on the circuit board through the solder filled into this device itself, without placing the cream solder and others on the circuit board in advance.

Figure 32A:
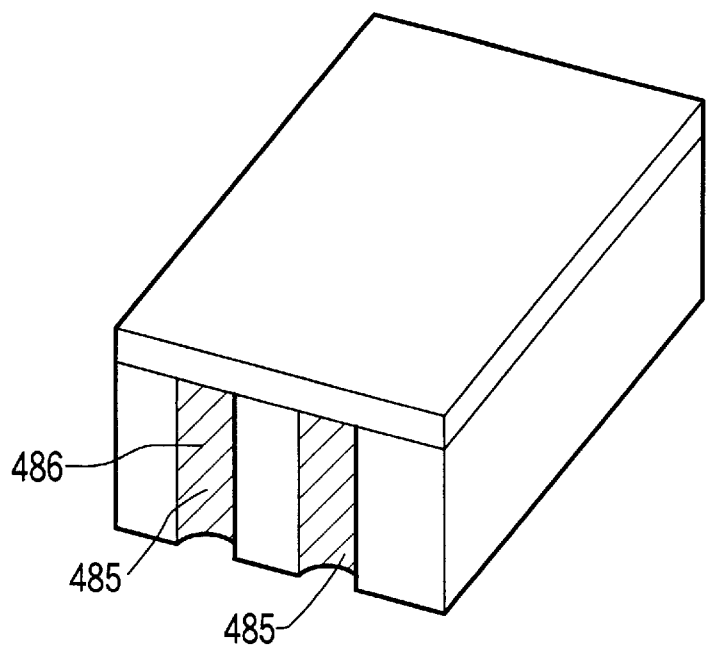
FIG. 32A is a perspective view showing a fifteenth or sixteenth embodiment of the ceramic package in the present invention.
Figure 32B:
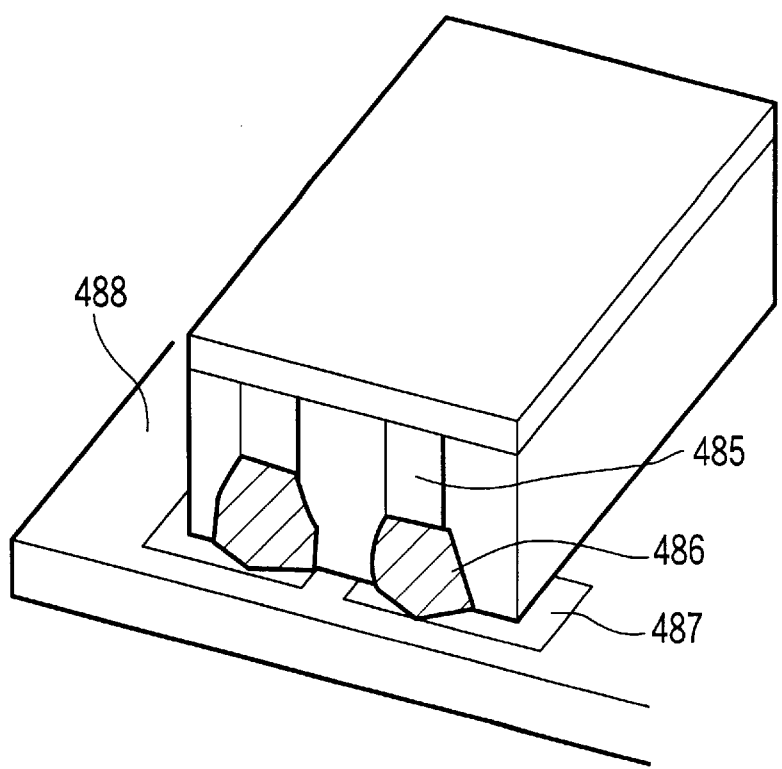
FIG. 32B is a perspective view showing a utilization example in the fifteenth or sixteenth embodiment of the ceramic package in the present invention.

FIGS. 32A and 32B show the fifteenth or sixteenth embodiment. As shown in FIG. 32A, a concave portion 485 is filled with a solder 486 in advance. Thus, as shown in FIG. 32B, this ceramic package type electronic part is placed on a circuit board 488 and merely heated. Hence, without sending the cream solder onto the circuit board 488, the solder 486 filled into the concave portion 485 is fused by the heating operation, and sent out onto a connection land 487 on the circuit board 488, and then cooled, and thereby the electric part and the circuit board 488 are connected to each other through the solder. According to the fifteenth or sixteenth embodiment, it is not necessary to send the cream solder onto the mother board or the circuit board 488. Therefore, it is possible to use the simple configuration to thereby obtain the effects in the eighteenth to fourteenth embodiments.

A seventeenth embodiment will be described below. The seventeenth embodiment is a ceramic package provided with a base for fixing an electronic device and a cover for enclosing the electronic device in this base, in which an outer electrode linked to an inner electrode for fixing the electronic device on the base is composed of a side electrode positioned on a side of the base and a bottom surface electrode positioned on a bottom surface of the base, and a part of this side electrode is stuck from the side of the base into the inside thereof.

An eighteenth embodiment will be described below. The eighteenth embodiment is a ceramic package provided with a base for fixing an electronic device and a cover for enclosing the electronic device in the base, and comprises an outer electrode linked to an inner electrode for fixing the electronic device on the base and a dummy outer electrode that is not linked to the inner electrode, in which the outer electrode and the dummy outer electrode are composed of a side electrode positioned on a side of the base and a bottom surface electrode positioned on a bottom surface of the base.

The seventeenth and eighteenth embodiments have the advantageous points in the already described eighth to sixteenth embodiments. The material of the electrode is not limited, in the seventeenth and eighteenth embodiments.

As mentioned above, according to the present invention, the inner electrode and the outer electrode in the ceramic package have the special configurations, and the side of the ceramic package on which the outer electrode is formed has the special configuration. Thus, it is possible to establish under the sufficiently high reliability the adhesive strength and the bonding strength between the ceramic package and the electronic device to be hermetically enclosed in the ceramic package and the adhesive strength and the bonding strength between this ceramic package or the ceramic package type electronic part and the circuit board serving as the mother board on which it is mounted.

What is claimed is:

1. A ceramic package type electronic part for accommodating an electronic device, comprising:

a ceramic package body;

at least one electrode which is disposed upon a bonding surface of said ceramic package body to be bonded to said electronic device; and a conductive adhesive which bonds said electronic device and said electrode to each other, wherein said conductive adhesive is disposed from a bonding portion of said electronic device and said electrode, to a specified non bonding portion of a surface of said ceramic package body.

2. The ceramic package type electronic part according to claim 1, wherein a thermal expansion coefficient of each of said ceramic package body and said electronic device are substantially matched with each other.

3. The ceramic package type electronic part according to claim 1, wherein said specified non bonding surface portion is selected to have a higher surface roughness than a part of said ceramic package body surface portion on which said conductive adhesive is not disposed.

4. The ceramic package type electronic part according to claim 1, wherein said specified non bonding surface portion is a different part of said ceramic package than a surface portion on which said electrode is disposed.

5. The ceramic package type electronic part according to claim 1, wherein said ceramic package body has at least one concave section, and said specified non bonding surface portion is an inner bottom surface portion of said concave section of said ceramic package body.

6. The ceramic package type electronic part according to claim 1, wherein said ceramic package body has at least one concave section, and said specific surface portion is an inner side surface portion of said concave section of said ceramic package body.

7. The ceramic package type electronic part according to claim 1, wherein a surface roughness of said specified non bonding surface portion is in a range from 1 micron to 50 microns.

8. The ceramic package type electronic part according to claim 1, wherein a surface roughness of said specified non bonding surface portion is in a range from 10 microns to 20 microns.

9. A ceramic package type electronic part for accommodating an electronic device, comprising:

a ceramic package body having a concave section;

at least one electrode which is disposed upon said ceramic package body and which is to be bonded to said electronic device; and a conductive adhesive which bonds said electronic device and said electrode to each other, wherein said electrode is disposed in a position away from an inner corner portion of said concave section, and said conductive adhesive is provided to fill said inner corner portion and to be extended to a surface portion of said inner corner portion, from a bonding portion of said electronic device and said electrode.

10. A ceramic package type electronic part for accommodating an electronic device, comprising:

a ceramic package body;

an electrode which is disposed for said ceramic package body and which is to be bonded to said electronic device; and a conductive adhesive which bonds said electronic device and said electrode to each other, wherein said conductive adhesive is provided to be extended to a specific surface portion of a surface portion of said ceramic package body, from a bonding portion of said electronic device and said electrode, wherein one end of said electronic device is bonded with said conductive adhesive to said electrode, and the other end of said electronic device is a free end which is not fixed to said ceramic package body.

11. The ceramic package type electronic part according to claim 10, wherein said one end of said electronic device is embedded in said conductive adhesive.

12. The ceramic package type electronic part according to claim 10, wherein said ceramic package body includes a base and a cover which encloses said base, and said conductive adhesive is provided to be extended to a bottom surface portion of said cover, from a bonding portion of said electronic device and said electrode.

13. A ceramic package comprising:

a base fixing an electronic device;

at least one inner electrode disposed inside said base and at least electrically connected to said electronic device; and an outer electrode disposed outside said base and at least electrically connected to said inner electrode, wherein a surface portion of said outer electrode is made of refractory material which is superior in solderability to a surface portion of said inner electrode.

14. The ceramic package according to claim 13, wherein said electronic device and said inner electrode are at least physically connected by a conductive adhesive.

15. The ceramic package according to claim 13, wherein said surface portion of said inner electrode comprises alloy of silver and palladium, and said surface portion of said outer electrode comprises gold (Au).

16. The ceramic package according to claim 13, wherein said outer electrode includes a side surface electrode positioned on an outer side surface portion of said base, and a bottom surface electrode positioned on an outer bottom surface portion of said base.

17. The ceramic package according to claim 16, wherein said side surface electrode has a portion projecting from said outer side surface portion into said base.

18. A ceramic package comprising:

a base fixing an electronic device;

an inner electrode disposed inside said base and connected to said electronic device; and an outer electrode disposed outside said base and connected to said inner electrode, wherein a surface portion of said outer electrode is made of refractory material which is superior in solderability to a surface portion of said inner electrode, wherein said outer electrode includes a side surface electrode positioned on an outer side surface portion of said base and a bottom surface electrode positioned on an outer bottom surface portion of said base; and wherein said side surface electrode is positioned in a specific concave portion disposed on said outer side surface portion.

19. The ceramic package according to claim 18, wherein said specific concave portion is a longitudinal groove.

20. The ceramic package according to claim 18, wherein a dummy side surface electrode is provided in said specific concave portion not to be connected to said inner electrode.

21. The ceramic package according to claim 18, wherein said specific concave portion is filled with solder, and said solder fills said specific concave portion such that when said solder is fused by heating, said ceramic package is fixed to a circuit board with said fused solder.

22. A ceramic package comprising:

a base fixing an electronic device;

at least one inner electrode disposed inside said base and connected to said electronic device; and an outer electrode disposed outside said base and connected to said inner electrode, wherein said outer electrode includes a side surface electrode positioned on an outer side surface portion of said base and a bottom surface electrode positioned on an outer bottom surface portion of said base, and said side surface electrode has a portion projecting from said outer side surface portion into said base.

23. A ceramic package comprising:

a base disposed to fix an electronic device;

at least one inner electrode disposed inside said base and connected to said electronic device;

an outer electrode disposed outside said base and connected to said inner electrode; and an outer dummy electrode disposed outside said base not to be connected to said inner electrode, wherein at least one of said outer electrode and said outer dummy electrode includes a side surface electrode positioned on an outer side surface portion of said base and a bottom surface electrode positioned on an outer bottom surface portion of said base.

* * * * *